United States Patent [19]
Tadaki et al.

[11] Patent Number: 5,349,218
[45] Date of Patent: Sep. 20, 1994

[54] SEMICONDUCTOR INTEGRATED CIRCUIT DEVICE INCLUDING MEMORY CELLS HAVING A STRUCTURE EFFECTIVE IN SUPPRESSION OF LEAK CURRENT

[75] Inventors: Yoshitaka Tadaki, Hamura; Toshihiro Sekiguchi, Ome; Hiroyuki Uchiyama, Kodaira, all of Japan; Toru Kaga, Albany, Calif.; Jun Murata, Kunitachi; Osaomi Enomoto, Tsuchiura, both of Japan

[73] Assignees: Hitachi, Ltd.; Texas Instruments Japan, Inc., both of Tokyo, Japan

[21] Appl. No.: 875,653

[22] Filed: Apr. 29, 1992

[30] Foreign Application Priority Data

Apr. 30, 1991 [JP] Japan ................................. 3-098868

[51] Int. Cl.$^5$ ............................................. H01L 29/78
[52] U.S. Cl. ...................................... 257/296; 257/301
[58] Field of Search ............................... 257/296, 301

[56] References Cited

FOREIGN PATENT DOCUMENTS

| | | |
|---|---|---|
| 166071 | 8/1980 | China . |
| 0177066 | 10/1985 | European Pat. Off. . |
| 0236089 | 9/1987 | European Pat. Off. . |
| 0399060 | 5/1989 | European Pat. Off. . |
| 0369132 | 9/1989 | European Pat. Off. . |
| 0386947 | 3/1990 | European Pat. Off. . |
| 61-207058 | 9/1986 | Japan . |
| 61-274357 | 12/1986 | Japan . |
| 1018253 | 1/1989 | Japan . |
| 1160047 | 6/1989 | Japan . |
| 1280350 | 11/1989 | Japan . |
| 1280350 | 11/1989 | Japan . |
| 1280351 | 11/1989 | Japan . |
| 21967 | 1/1990 | Japan . |
| 22670 | 1/1990 | Japan . |
| 2009166 | 1/1990 | Japan . |
| 287571 | 3/1990 | Japan . |

OTHER PUBLICATIONS

JEE Journal of Electronic Engineering, vol. 26, No. 268, Apr. 1989, pp. 68–70, "Toshiba Presents 45ns 16M-Bit DRAM with Triple-Well Structure".

International Electron Devices Meeting 1988, Technical Digest, Dec. 1988, W. Wakamiya et al.: "Fully Planarized 0.5 μm Technologies for 16M DRAM".

*Primary Examiner*—Jerome Jackson
*Assistant Examiner*—Stephen D. Meier
*Attorney, Agent, or Firm*—Antonelli, Terry, Stout & Kraus

[57] ABSTRACT

A semiconductor integrated circuit device has a semiconductor memory cell array including word lines, data lines and a plurality of memory cells provided at cross points of the word and data lines. Each memory cell has a cell selection transistor and an information storage capacitor connected in series. The cell selection transistor in one cell includes first and second doped regions formed in a main surface of a semiconductor substrate, a first insulating film formed on the main surface between the first and second doped regions and a control electrode layer formed on the first insulating film between the first and second doped regions. The first doped region is connected with a data line, while the control electrode is connected with a word line. The information storage capacitor includes a second insulating film formed on the wall of one trench formed on the main surface of the substrate, an electrode layer formed on the second insulating film and serving as a first electrode of the capacitor, a dielectric film formed on the electrode layer and a conducting material provided to fill a space defined by the dielectric film in the trench and serving as a second electrode of the capacitor. The second doped region of the transistor terminates at the wall of the trench. A conducting layer is provided to extend both on the second doped region and the conducting material in the cell to electrically interconnect them for the series connection.

21 Claims, 15 Drawing Sheets

SEMICONDUCTOR INTEGRATED CIRCUIT DEVICE INCLUDING MEMORY CELLS HAVING A STRUCTURE EFFECTIVE IN SUPPRESSION OF LEAK CURRENT

BACKGROUND OF THE INVENTION

The present invention relates to a semiconductor integrated circuit device having a memory.

The memory cells of, for example, a typical DRAM (Dynamic Random Access Memory) are each comprised of a series circuit of a memory cell selection MISFET and an information storage capacitor.

High integration has been achieved in the technical field of the DRAMs so that the memory cells are yearly miniaturized more and more. These highly integrated memory cells must have their minute planes formed with the memory cell selection MISFETs and the information storage capacitors. In this case, too, the capacitors must have a capacitance no lower than a predetermined value. In order to satisfy these requirements, there have been proposed a variety of memory cells.

For example, a first DRAM is exemplified, as disclosed on pp. 592–595 of IEDM '88, by a memory cell (which will be shortly referred to as the "STC (Stacked Capacitor Cell)") which is constructed such that a first electrode of an information storage capacitor connected with a memory cell selection MISFET and a second electrode of the capacitor adapted to have a predetermined constant potential applied thereto are formed over a semiconductor substrate, and such that the first and second electrodes are laid over a gate electrode of the memory cell selection MISFET.

Next, a second DRAM is exemplified, as disclosed in U.S. Pat. No. 4,786,954 issued on Nov. 22, 1988 and assigned to Nippon Telegraph & Telephone Public Corporation, by a memory cell which is constructed such that a semiconductor substrate is formed in its principal surface with trenches, such that a first electrode of an information storage capacitor connected with a memory cell selection MISFET and a second electrode of the capacitor adapted to have a predetermined constant potential applied thereto are buried in those trenches and such that the first electrode of the capacitor and the source or drain region of the memory cell selection MISFET are connected at the side faces of the trenches.

Next, a third DRAM is exemplified, as disclosed on pp. 1257–1263 of IEEE Transactions On Electron Devices, Vol. 35, No. 8, August 1988, by a memory cell which is constructed such that a semiconductor substrate is formed in its principal surface with trenches, such that a first electrode of an information storage capacitor connected with a memory cell selection MISFET and a second electrode of the capacitor adapted to have a predetermined constant potential applied thereto are buried in those trenches, and such that the trenches have their bottoms formed with semiconductor regions for applying a predetermined constant potential to the second electrode.

Next, a fourth DRAM is exemplified, as disclosed in JP-B-58-56266 (published on Dec. 14, 1983), by a memory cell which is constructed such that a semiconductor substrate is formed in its principal surface with trenches, such that a first electrode of an information storage capacitor connected with a memory cell selection MISFET and a second electrode of the capacitor adapted to have a predetermined constant potential applied thereto are buried in those trenches, and such that a third electrode connected with the memory cell selection MISFET and made of a semiconductor region is formed on the surface portions of the trenches of the semiconductor substrate. This memory cell has its capacitance increased by a first capacitance between the first and second electrodes, a second capacitance between the second and third electrodes, and a third capacitance between the third electrode and the semiconductor substrate.

On the other hand, a structure forming an information storage capacitor by using trenches is disclosed in JP-A-51-130178 (laid-open on Nov. 12, 1976) and JP-A-59-191373 (laid-open on Oct. 30, 1984).

SUMMARY OF THE INVENTION

The inventors have investigated DRAMs of the type mentioned above and have found the following facts.

In DRAMs similar to the aforementioned first DRAM, the first and second electrodes of the information storage capacitor are laminated over the semiconductor substrate so that a step on the surface is enlarged at the memory cell portion. This surface step makes wiring or interconnection difficult in case the connection conductors are to be formed on the information storage capacitor. This may cause a shorting between the adjoining connection or wiring conductors.

In DRAMs similar to the aforementioned second DRAM, the first electrode of the information storage capacitor and the source or drain region of the memory cell selection MISFET are connected by the side faces of the trenches so that formation of connection holes in the side faces is complicated and made difficult.

In DRAMs similar to the aforementioned third DRAM, the semiconductor region is formed in the semiconductor substrate and has a predetermined constant potential applied thereto. As a result, the p-n junction area between the semiconductor substrate and semiconductor region is enlarged to have a tendency such that a standby current is increased. In the vicinity of the bottoms of the trenches, moreover, crystal defects are liable to occur, which may cause shorting between the semiconductor substrate and the semiconductor region.

In DRAMs similar to the aforementioned fourth DRAM, the third electrode of the information storage capacitor is disposed in the semiconductor substrate, which may cause soft errors by alpha rays.

The main object of the present invention is to provide a semiconductor integrated circuit device having a memory cell array including a plurality of memory cells each being comprised of a series connection of a cell selection transistor and an information storage capacitor, wherein leakage current from the information storage capacitor is suppressed.

Another object of the present invention is to provide a semiconductor integrated circuit device having the above-mentioned structure, wherein the possibility of at least one of the above-mentioned inconveniences is reduced with leakage current from the information storage capacitor being suppressed.

According to one aspect of the present invention, a semiconductor integrated circuit device has a semiconductor memory cell array including word lines and data lines and a plurality of memory cells each provided at a cross point between one of the word lines and one of the data lines.

Each memory cell has a cell selection transistor and an information storage capacitor connected in series. The cell selection transistor in one cell includes first and second doped regions formed in a main surface of a semiconductor substrate, a first insulating film formed on the main surface of the semiconductor substrate between the first and second doped regions and a control electrode layer formed on the first insulating film between the first and second doped regions. The first doped region is connected with a data line, while the control electrode is connected with a word line.

The information storage capacitor includes a second insulating film formed on the wall of one trench formed on the main surface of the semiconductor substrate, an electrode layer formed on the second insulating film and serving as a first electrode of the capacitor, a dielectric film formed on the electrode layer and a conducting material provided to fill a space defined by the dielectric film in the trench and serving as a second electrode of the capacitor. The second doped region of the transistor terminates at the wall of the trench. A conducting layer is provided to extend both on the second doped region and the conducting material in the cell to electrically interconnect them for the series connection.

According to another aspect of the present invention, a memory cell having no inversion layer formed on the surface of the semiconductor substrate of the side walls of the trenches, even if the second insulating films are thinned, can be realized by burying the first and second electrodes of the information storage capacitors in the trenches and by positioning the first electrodes having a predetermined fixed potential applied thereto on the inner walls of the trench, which inner walls are surface portions of the semiconductor substrate. Thus, the first insulating films can be thinned to reduce the size of the memory cells.

According to another aspect of the present invention, the memory cells strengthened against soft errors due to alpha rays can be realized by setting the thickness of the second insulating film such that no inversion layer may be formed on the surface portions of the semiconductor substrate at the inner walls of the trenches. For this reason, moreover, the memory cells realized can reduce leakage current between the information storage capacitors.

According to another aspect of the present invention, a third doped region is formed below the first and second doped regions of the cell selection transistors so as to contact the second insulating films in the trenches, and the third doped region is in a conductivity type identical to that of the semiconductor substrate and has a higher impurity concentration than that of the semiconductor substrate. Thus, it is possible to prevent the leakage current which is caused by the fact that electrons from electron-hole pairs produced in depletion layers in the semiconductor substrate surface portions of the inner walls of the trenches when the fixed potential is applied to the first electrode flow into the second doped region.

According to another aspect of the present invention, the second electrode and the second doped region can be connected by a conducting layer to realize a stabilized contact therebetween. Moreover, the manufacture process can be made simpler than that of the case in which connection portions are formed on the side walls of the trenches.

According to another aspect of the present invention, the semiconductor integrated circuit device can be miniaturized by extending transverse conducting layers in a band shape to traverse the data lines and the word lines and by electrically interconnecting the first electrodes of the information storage capacitors of the memory cells in the word line direction with each other.

According to another aspect of the present invention, the transverse conducting layers have end portions connected at the end portions of memory blocks with each other by the material identical to that of the transverse conducting layers and are connected with the material having a lower resistance than that of the transverse conducting layers so that the fixed potential to be applied to the first electrodes of the information storage capacitors can be stabilized.

According to another aspect of the present invention, a conducting layer for connecting the second electrode of the information storage capacitor and the second doped region of the memory cell selection transistor can be formed on the surface of the semiconductor substrate in self-alignment with the control electrode of the transistor so that the memory cells can be miniaturized.

DESCRIPTION OF THE PREFERRED EMBODIMENTS

Figure 1:
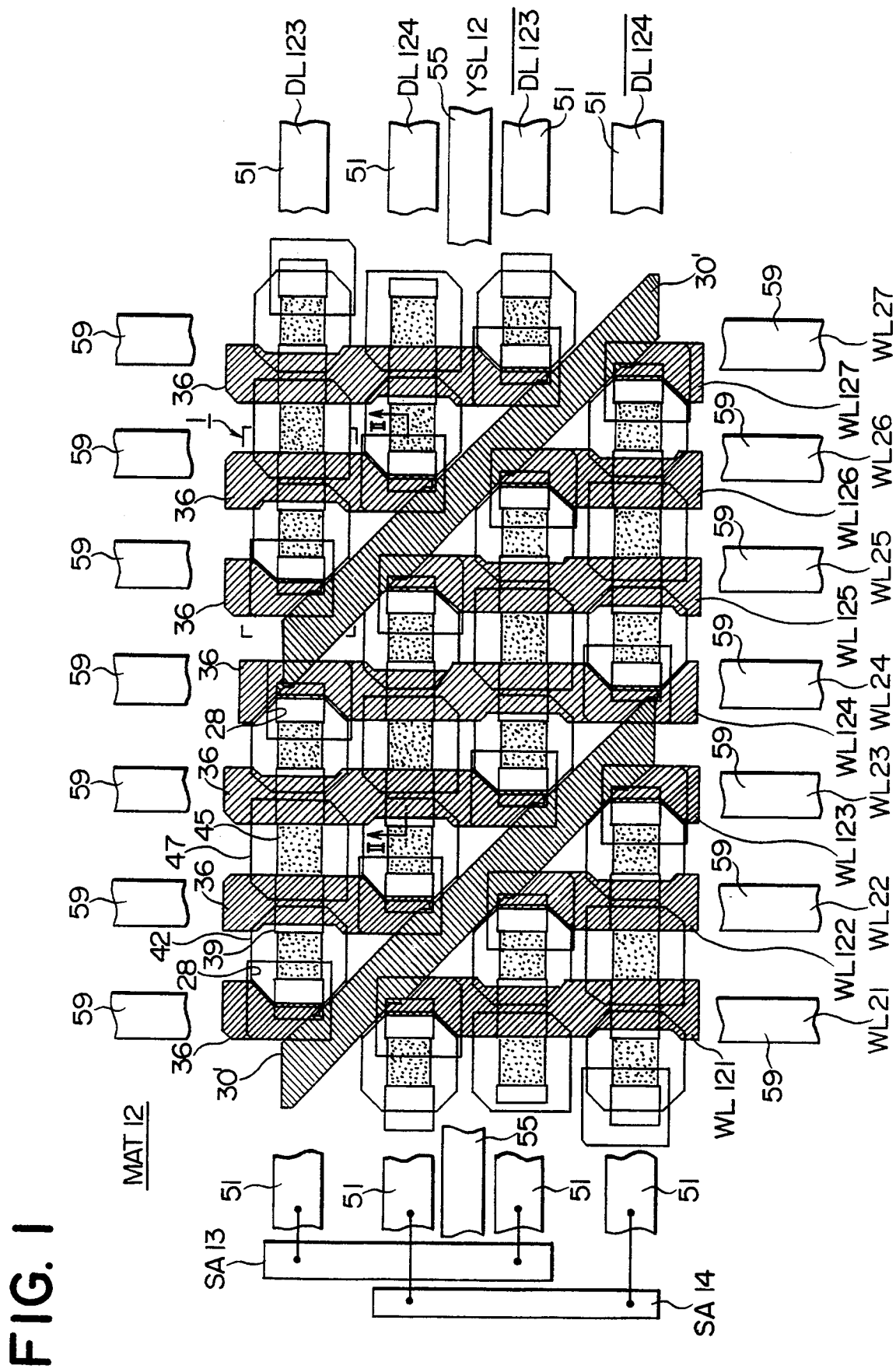
FIG. 1 is a top plan view showing an essential portion of a memory cell of a DRAM according to Embodiment 1 of the present invention.

A semiconductor integrated circuit device of the present invention will be described in the following by taking as examples DRAMs which include memory cells each having a memory cell selection MISFET and an information storage capacitor connected in series.

Incidentally, throughout the Drawings for explaining the embodiments, those parts having similar functions will be designated with the same reference characters, and their repeated descriptions will be omitted.

Embodiment 1

FIG. 1 is a top plan layout diagram of memory cells. Incidentally, FIG. 1 shows a portion of a memory block MAT 12 of FIG. 14, as will be hereinafter referred to, and sense amplifiers SA13 and SA14 forming part of the former.

As shown in FIG. 1, a memory block MAT is arranged with a plurality of data lines (DL) 51 extending in a row direction and a plurality of word lines (WL) 36 extending in a column direction. The individual memory cells 1 (whose reference numeral will be omitted hereafter) are connected with the data lines 51 and the word lines 36 and are arranged at a predetermined pitch in a matrix form.

Moreover, a plurality of transverse conducting layers 30', each shared among several memory cells, are so arranged in the memory blocks MAT as to extend at an (acute) angle of, for example, about 45 degrees with respect to the row and column directions. These transverse conducting layers 30' play a role to connect the plate electrodes 30 (which have a fixed potential of the information storage capacitors applied thereto) in trenches 28 of a plurality of memory cells arrayed in the column direction thereby to feed the fixed potential to the plate electrodes 30 in the trenches 28.

In the memory block MAT, the four data lines 51 constitute a unit block having a unit pitch, and a plurality of unit blocks are arranged in a repeated pattern in the column direction. In other words, the layout diagram of FIG. 1 shows an essential portion of one of the unit blocks arranged repeatedly in the column direction. Moreover, the four data lines 51 in the unit block form two interdigitated data line pairs and are connected with different sense amplifiers SA which are positioned at the end portion of the memory block MAT. With this connection relation between the data lines 51 and the sense amplifiers SA, one sense amplifier SA may be arranged for four data lines 51, thus enjoying an effect that the sense amplifiers SA can be laid out according to a relatively less strict design rule.

Figure 2:
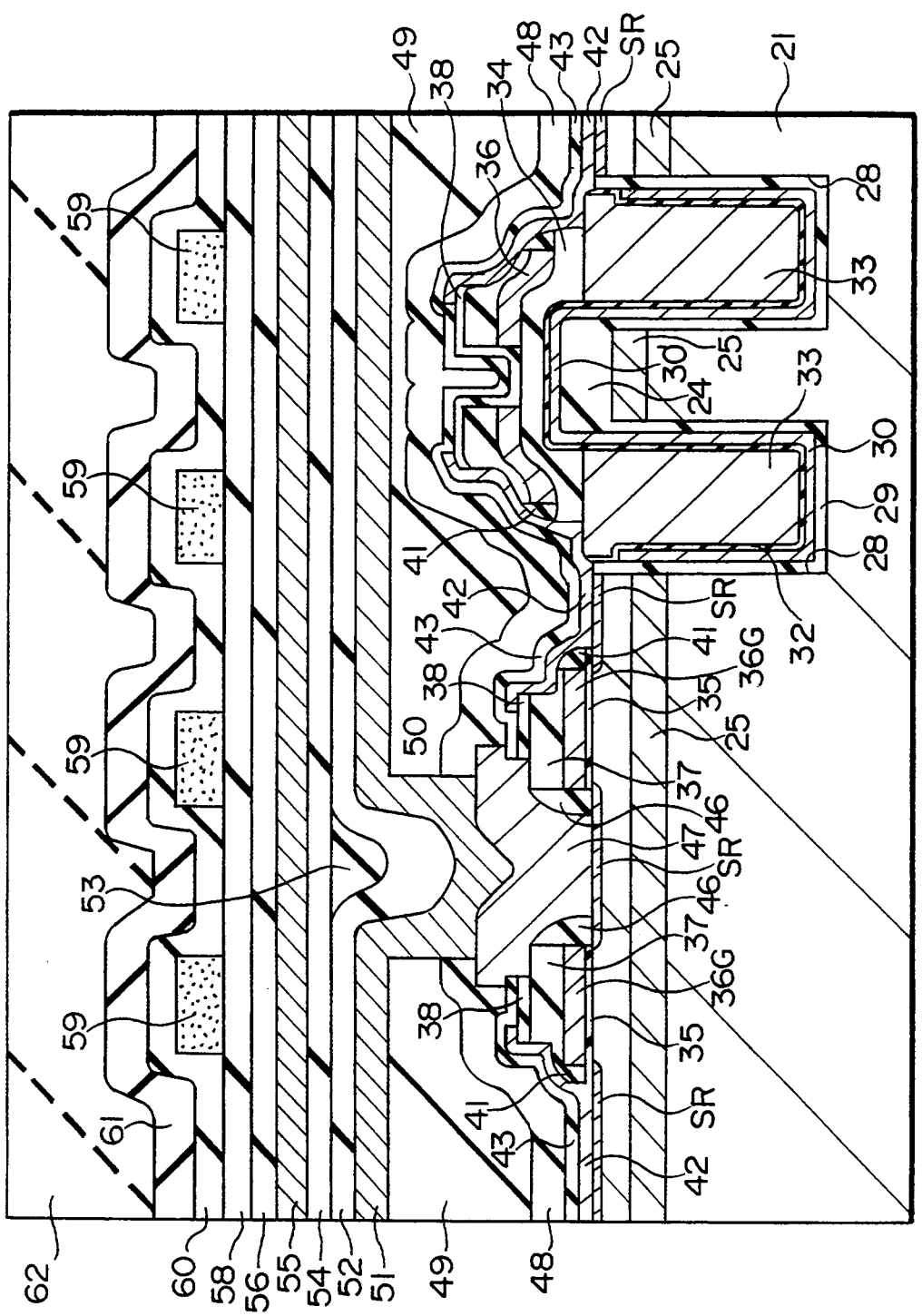
FIG. 2 is a section showing a portion of the aforementioned memory cell.

FIG. 2 is a section taken along line II—II of FIG. 1.

As shown in FIG. 2, the DRAM according to an embodiment of the present invention is formed on a main or principal surface of a p-type semiconductor substrate 21 made of single crystal silicon. This p-type semiconductor substrate 21 uses its (100) crystal plane as an element forming surface 1 and has a specific resistance of about 8 to 12 [$\Omega$/cm], for example. The memory cell includes a series circuit of a memory cell selection MISFET formed on the surface of the p-type semiconductor substrate 21 and an information storage capacitor.

The memory cell selection MISFET has a gate electrode (control electrode) 36G formed integrally with the word line 36 over a gate insulating film 35, and n-type semiconductor doped regions SR formed in self-alignment with the electrode 36G. These n-type semiconductor doped region SR have a function of either the source or drain region of the memory cell selection MISFET. Moreover, this memory cell selection MISFET is set to have a threshold voltage of, for example, 0.5 to 1.0 [IV].

The information storage capacitor has a plate electrode 30, a node electrode 33 and a dielectric film 32, which are formed in a trench 28 formed in the p-type semiconductor substrate 21 through an insulating film 29 made of, for example, a silicon oxide film. The node electrode 33 is connected with either of the source or drain doped region of the memory cell selection MISFET through a conducting layer or a first connecting electrode 42 made of, for example, a poly-silicon layer. The information storage capacitor in this embodiment has its trench 28 formed to have, for example, a square section, and the surface portion of the p-type semiconductor substrate 21 at the inner wall or at the side wall and bottom of the trench 28 is not used as the electrode of the information storage capacitor. Thus, the plate electrode 30 is fed with a voltage of ½ Vcc (e.g., 1.65 [V]), for example, but the insulating film 29 on the inner wall of the trench 28 is set to have a thickness of 3.3 (i.e., 1.65 [V]/0.5 [V]) times or more as large as that of the gate insulating film 35 of the memory cell selection MISFET (0.5 [V] is an exemplary value for a threshold voltage of an n MOS transistor.) In other words, the insulating film 29 is made so thick that no inversion layer is formed on the surface portion of the p-type semiconductor substrate 21 at the inner wall of the trench 28 even if the electric field of the plate electrode 30 is applied to the surface portion of the p-type semiconductor substrate 21. In the present embodiment, for example, the gate insulating film 35 has a thickness of about 11 to 12 [nm] so that the insulating film 29 is formed to have a thickness of about 50 [nm].

Since the memory cell of this embodiment does not use the surface portion of the p-type semiconductor substrate 21 at the trench 28 as a capacitor electrode, it is highly resistant to soft errors due to the alpha rays and can prevent leakage current between the information storage capacitors to provide a DRAM having a low power consumption.

Since, moreover, the node electrode 33 of the information storage capacitor is connected on the surface of the p-type semiconductor substrate 21 with either the source or drain region of the memory cell selection MISFET through the first connecting electrode 42 made of, for example, a poly-silicon layer, its connection is facilitated and stabilized to have a low connection resistance. Since, on the other hand, the first connecting electrode 42 is formed in self-alignment with the word lines 36, the memory cell can be miniaturized.

Below the memory cell as shown in FIG. 2, moreover, the p-type semiconductor substrate 21 is formed therein with a p-type semiconductor doped layer 25 which has a higher impurity concentration than that of the p-type semiconductor substrate 21. The p-type semiconductor layer 25 is formed in contact with an element isolating insulating film 24 around the memory cell. The p-type semiconductor layer 25 functions as a channel stopper for isolating the elements below the element isolating insulating film 24 to prevent the leakage current between the elements (e.g., between two adjacent trenches 28). Since, moreover, the p-type semiconductor layer 25 is in contact with the insulating film 29 formed on the inner wall of the trench 28, it can prevent a leakage current which would otherwise be caused at the inner wall of the trench 28 as a result of electrons from electron—hole pairs, produced in the depletion layer formed on the surface of the p-type semiconductor substrate 21, flowing into the n-type semiconductor doped region SR. This is because the surface portion at the inner wall of the trench 28 of the p-type semiconductor substrate 21 and the n-type semiconductor region SR of the memory cell selection MISFET are isolated by the p-type semiconductor layer 25. In other words, the p-type semiconductor layer 25 can block the inflow of electrons (or can form a potential barrier).

On the other hand, another connecting electrode 47 is formed through a side wall spacer 46 in self-alignment with the gate electrode 36G (or word line 36) so that the memory cell can be miniaturized.

Since, moreover, the connection between the data line 51 and the n-type semiconductor region SR is accomplished through the connecting electrode 47 made of, for example, a poly-silicon layer, the data line 51 can be made of a metal layer such as tungsten. This tungsten layer can form the data line having an excellent step coverage and a low resistance, because it has a better step coverage than aluminum.

Since, moreover, the information storage capacitor has its electrodes formed in the trench 28 in the p-type semiconductor substrate 21, the overlying wiring or connection layers can be formed fine and highly precise.

In the section taken along line II—II of FIG. 1, moreover, a second wiring or connection layer 55 could not be located, because its portion is omitted. In FIG. 2, however, the second wiring layer 55 is shown while assuming its presence in FIG. 2.

Next, a third wiring or connection layer 59 is a shunting word line (WL) 59, which is a complex layer made of or mainly of an aluminum layer. The word line 36 is connected with the shunting word line 59 at the end portion of the memory block MAT. Incidentally, this connecting method will be described hereinafter.

The layers left unexplained here will be described in connection with the manufacture process.

Now, the process for manufacturing the DRAM according to an embodiment of the present invention, especially, the memory cell will be described with reference to FIGS. 2 to 13.

At first, a p-type semiconductor substrate 21 made of single-crystal silicon is prepared.

Next, a silicon oxide film 22 and a silicon nitride film 23 are sequentially formed over the principal surface of the p-type semiconductor substrate 21. The silicon oxide film 22 is formed by a steam oxidation at about 900 to 1,000 [° C.] to have a thickness of about 20 to 40 [nm], for example. The silicon nitride film 23 is deposited by the CVD method, for example, to have a thickness of about 40 to 60 [nm].

Figure 3:
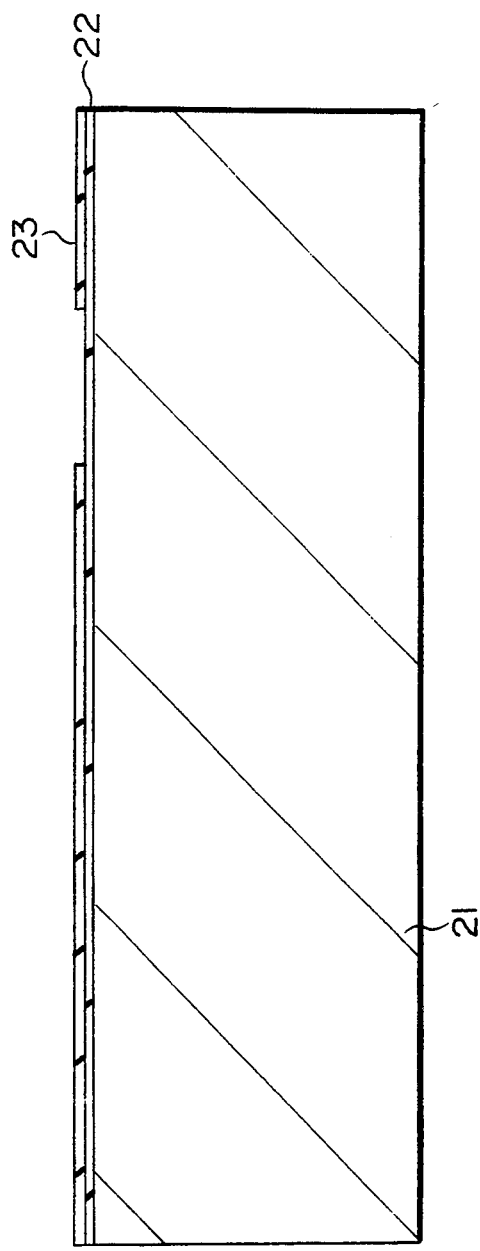
FIGS. 3 to 13 are sections showing a portion at respective manufacturing stages of the aforementioned memory cell.

Next, as shown in FIG. 3, openings are formed in the silicon nitride film 23 at portions for forming the element isolating insulating film 24 by the photolithography and etching technique. After this, as shown in FIG. 4, the element isolating insulating film 24 having a thickness of about 400 to 500 [nm] is formed by a thermal oxidation at a high temperature of about 1,050 to 1,150, [° C.] for example.

Figure 4:
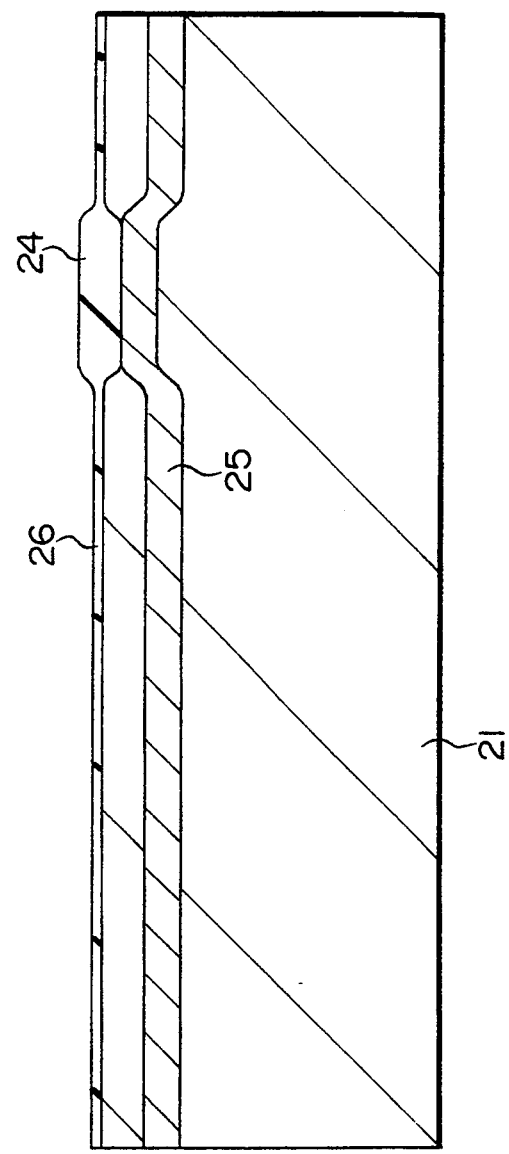

Next, as shown in FIG. 4, the silicon nitride film 23 is removed, and the p-type semiconductor substrate 21 is then implanted all over its surface with boron ions through the element isolating insulating film 24 to form the p-type semiconductor doped region 25. This p-type semiconductor region is set to have a dose of $10^{12}$ to $10^{13}$ [atoms/cm$^2$] and an impurity concentration of $10^{17}$ to $10^{18}$ [atoms/cm$^3$] and is formed by the ion implantation with an energy to contact the lower face of the element isolating insulating film 24. By the ion implantation under those conditions, the p-type semiconductor region 25 in the region without the element isolating insulating film 24 is formed deeper than the n-type semiconductor region 25 in the region with the element isolating insulating film 24.

Incidentally, this p-type semiconductor region 25 is formed to prevent the leakage current in the element isolating region at the peripheral circuit portion and the memory cell portion and to prevent the leakage current due to a gate diode formed parasitically at the inner wall of the trench 28 to be later formed.

Next, the p-type semiconductor substrate 21 has its silicon oxide film 22 removed from its surface and is then oxidized again, as shown in FIG. 4, to form a silicon oxide film 26 having a thickness of about 20 [nm].

Figure 5:
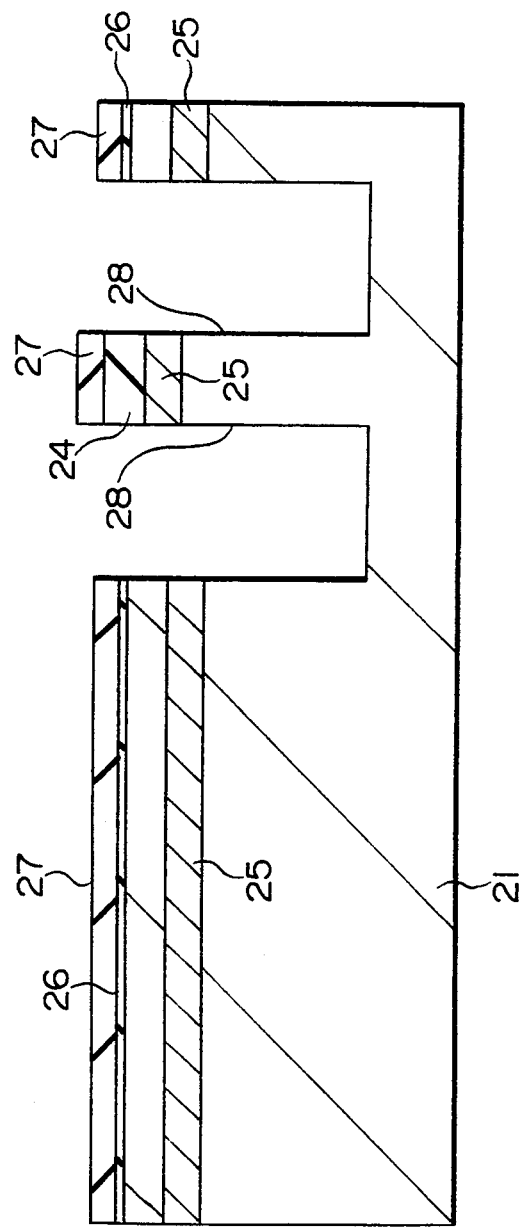

Next, a silicon nitride film 27 acting as an etching mask for forming trenches 28 later is formed to have a thickness of about 200 to 400 [nm]. After this, as shown in FIG. 5, by the photolithography and etching technique, the portions of the silicon nitride film 27 to be formed with the trenches are removed and etched by using as the mask either the silicon nitride film 27 or the silicon nitride film 27 and the patterning resist film of the silicon nitride film 27, to form the trenches 28 having a depth of 3 to 5 [μm] from the surface of the p-type semiconductor substrate 21. Those trenches 28 are so formed as to reach the end portions of the element isolating insulating film 24, i.e., to remove the bird's beaks of the element isolating insulating film 24. The trenches 28 are formed by the dry etching technique and have side faces substantially normal to the principal surface of the semiconductor substrate 21.

Next, the trenches 28 have their surfaces thermally oxidized to form a thermally oxidized silicon film having a thickness of about 30 [nm]. This thermally oxidized silicon film is provided to protect the surfaces of the trenches 28 from the hot phosphoric acid which is used to remove the silicon nitride film 27. Namely, the thermally oxidized silicon film can prevent the phosphorus contained in the phosphoric acid, i.e., an n-type impurity from entering the surface of the p-type semiconductor substrate 21 and accordingly prevent an n-type impurity layer from being formed.

Figure 6:
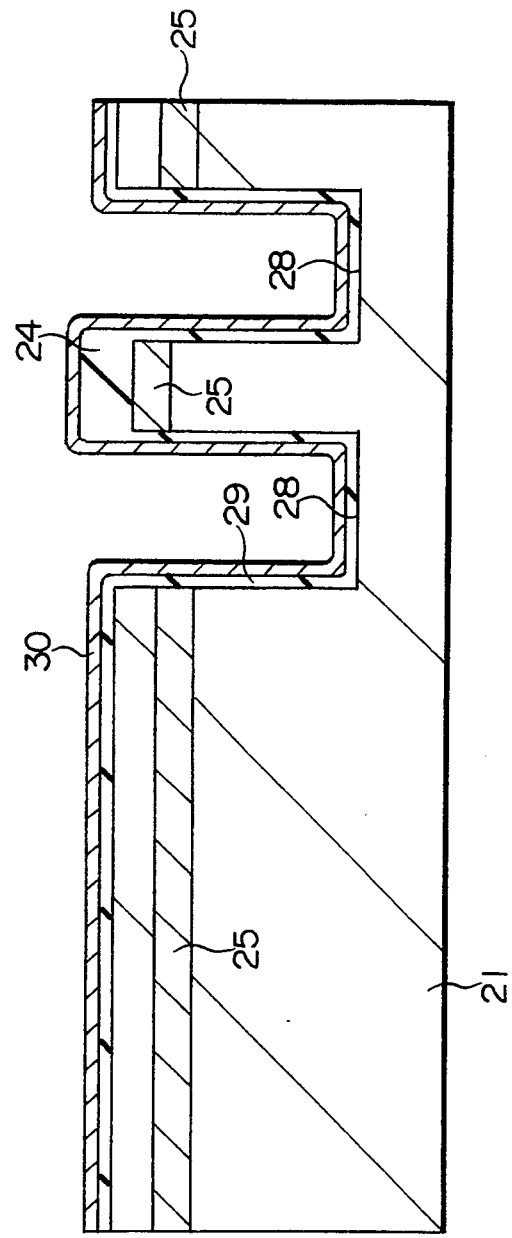

Next, the silicon nitride film 27 is removed to form the insulating film 29 such as a silicon oxide film having a thickness of about 50 [nm] by the CVD method, as shown in FIG. 6.

Next, a first-level poly-silicon layer 30 for one electrode of the information storage capacitor, i.e., the plate electrode 30 is formed to have a thickness of about 30 to 100 [nm]. Here, the doped poly-silicon layer is used, but a non-doped poly-silicon layer may be formed and then doped with phosphorus or arsenic. In the following steps, the poly-silicon layer is exemplified by the doped poly-silicon layer like this step but may be replaced by the non-doped poly-silicon layer. The poly-silicon layers to be formed at this and following steps are doped with phosphorus or arsenic at a concentration of about $10^{20}$ [atoms/cm$^3$].

Figure 7:
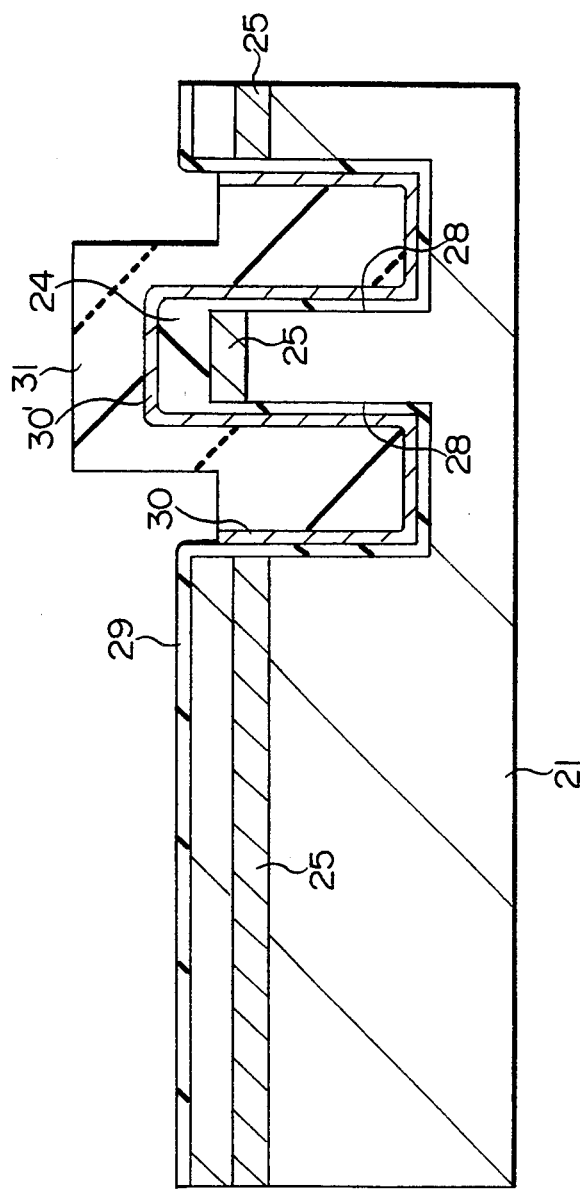

Next, the poly-silicon layer 30 is patterned by the photolithography technique, and the mask pattern used at this time corresponds to the pattern of the aforementioned transverse conducting layers 30' shown in FIG. 1. Specifically, as shown in FIG. 7, the pattern of a photoresist film 31, as shown in FIG. 7, is formed by an exposure with a pattern to cover the individual two trenches 28 of the two memory cells adjoining in the direction of data lines 51, for example, and by leaving the photoresist film 31 in the trenches 28 even in the unexposed region. In FIG. 7, for example, the photoresist film 31 left to project at the portion between the two trenches is the exposed portion, and the photoresist film 31 left unexposed sideways of the former is the photoresist film 31 which is not exposed but is left as a result of controlled developing conditions. The photoresist film 31 thus left by controlling the developing conditions has its surface set at a lower level than that of the surface of the p-type semiconductor substrate 21. By using the photoresist film 31 having such pattern as a mask, the poly-silicon layer 30 is etched to form the transverse conducting layer 30' (FIG. 1) and the plate electrodes 30 having the pattern shown in FIG. 7.

Figure 8:
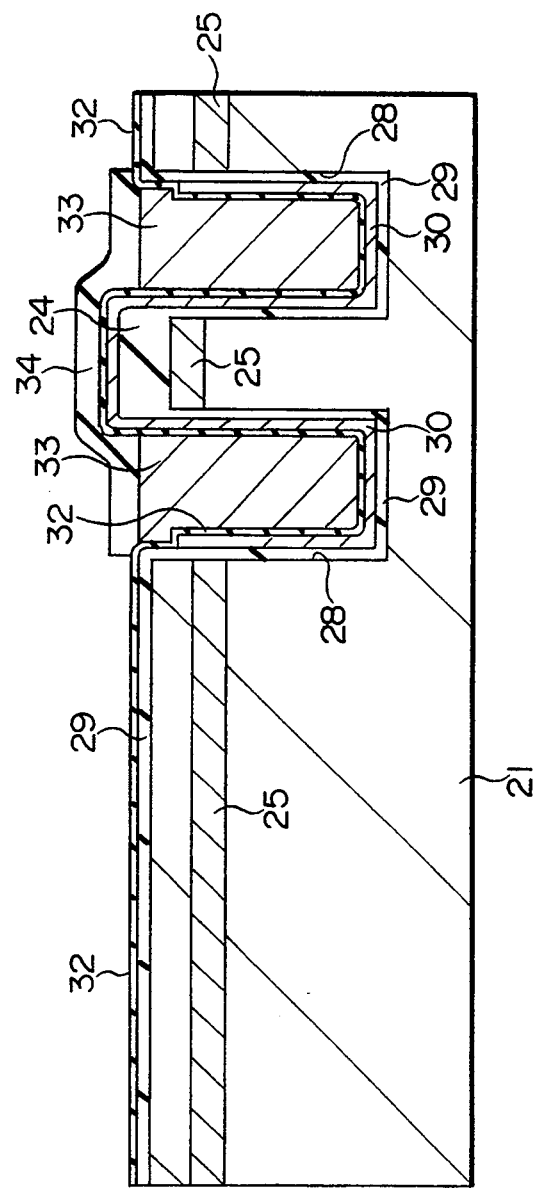

Next, after removal of the photoresist film 31, as shown in FIG. 8, the silicon nitride film for forming the dielectric film 32 of the information storage capacitor is deposited to have a thickness of about 4 to 10 [nm] and has its surface oxidized to form a silicon oxide film having a thickness of about 1 to 3 [nm]. Namely, the dielectric film 32 is formed of a two-layered film of the silicon nitride film/the silicon oxide film. This dielectric film 32 may be embodied by a three-layered film which is formed below the silicon nitride film with the silicon oxide film having a thickness of about 1 to 3 [nm] and which is composed of the silicon oxide film/the silicon nitrile film/the silicon oxide film. In this case, the intermediate silicon nitride film and the upper silicon oxide film are given a thickness equal to that of the aforementioned two-layered film.

Next, as shown in FIG. 8, the second-level poly-silicon layer 33 for forming the other electrode of the information storage capacitor, i.e., the node electrode 33 is formed to have a thickness of about 300 to 1,000 [nm]. At this time, the trenches 28 are filled with that poly-silicon layer 33.

Next, an etching-back operation is carried out to level the surface of the poly-silicon layer 33 generally with the surface of the p-type semiconductor substrate 21.

Next, a thermal oxidation is carried out to form an oxide film on the surface of the poly-silicon layer 33. This is to eliminate the pin holes or the like, which might be formed in the dielectric film 32 positioned on the surface of the poly-silicon layer 33 at the etching-back of the poly-silicon layer 33. In other words, the oxide film is formed on the surface of the poly-silicon layer 33 to prevent the dielectric breakdown of the dielectric film 32 of the information storage capacitor.

Next, an insulating film 34 such as a silicon oxide film is deposited by the CVD method and is treated, as shown in FIG. 8, with a pattern covering the trenches 28 by the photolithography and etching technique. The insulating film 34 is a layer for insulating the node electrode 33 and the word lines 36 to be formed over the former.

Figure 9:
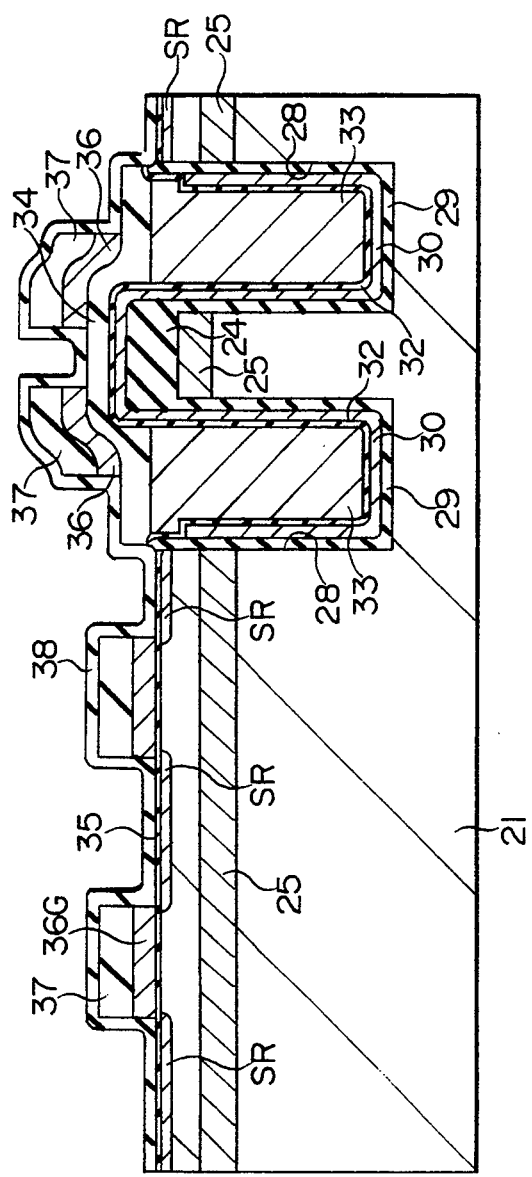

Next, the p-type semiconductor substrate 21 has its (silicon nitride+silicon oxide) double film 32 and silicon oxide film 29 removed from its surface and is formed, as shown in FIG. 9, with a silicon oxide film having a thickness of about 11 to 12 [nm] to form the gate insulating film 35 newly by thermal oxidation.

Next, the third-level poly-silicon layer for forming the gate electrode 36G and the word lines 36 is deposited to have a thickness of about 50 to 300 [nm], and an insulating film 37 such as a silicon oxide film is deposited over the former to have a thickness of about 100 to 300 [nm]. Moreover, the two are treated to the pattern of the word lines 36, as shown in FIG. 1, by the photolithography and etching techniques.

Next, in order to form the source and drain regions of the memory cell selection MISFETs, phosphorus or arsenic ions are implanted at a dose of about $10^{12}$ to $10^{13}$ [atoms/cm$^2$] to form n-type semiconductor regions SR in self-alignment with the gate electrode 36G (or word lines 36).

Next, as shown in FIG. 9, an insulating film 38 such as a silicon oxide film is deposited all over the surface to have a thickness of about 50 to 300 [nm] by the CVD method.

Figure 10:
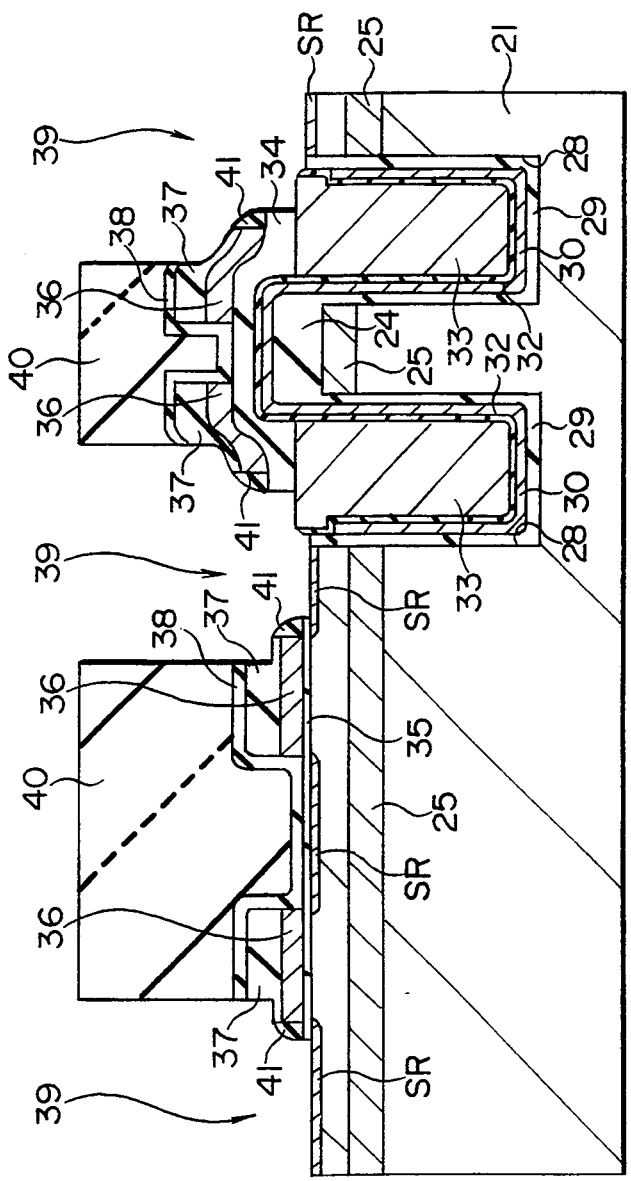

Next, as shown in FIG. 10, a photoresist film 40 having a pattern for forming openings 39 to connect the node electrode 33 of the information storage capacitor and the source or drain region of the memory cell selection MISFET is formed by the photolithography technique and is used as a mask for an anisotropic dry etching such as the RIE (Reactive Ion Etching). This etching step is made as deep as the total thickness of the insulating film 34 and the insulating film 38. Since, in this etching, the individual insulating films 37 over the gate electrode 36G and the word lines 36 are simultaneously etched, the insulating film 37 has to be made thicker than the total thickness of the insulating films 34 and 38 so that neither the gate electrode 36G nor the word lines 36 may have their surfaces exposed to the outside. By forming those openings 39, the node electrode 33 and the n-type semiconductor region SR have their surfaces exposed to the outside. Moreover, the gate electrode 36G and the word lines 36 have their individual side walls formed with a side wall spacer 41 made of the insulating film 38.

Figure 11:
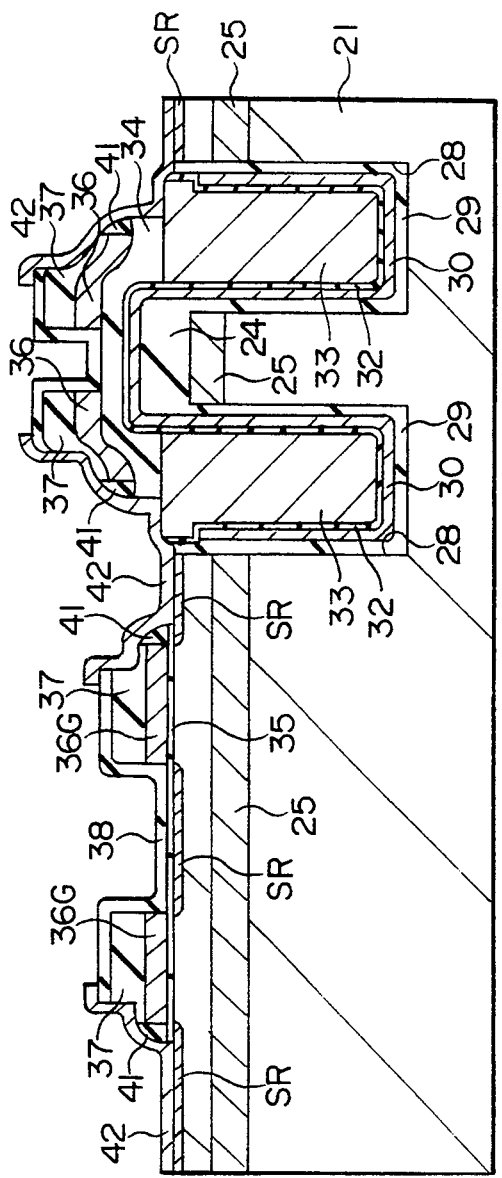

Next, after the photoresist film 40 has been removed, as shown in FIG. 11, a fourth-level poly-silicon layer for connecting the node electrode of the information storage capacitor and the source or drain region SR of the memory cell selection MISFET is deposited to have a thickness of about 50 to 100 [nm]. By the photolithography and etching techniques, moreover, a patterning is carried out to form a conducting layer or a first connecting electrode 42 so that the poly-silicon layer has its end portion positioned on the gate electrode 36G and the word lines 36. The first connecting electrode 42 is formed in self-alignment with the gate electrode 36G and the word lines 36. On the surface of the p-type semiconductor substrate 21, moreover, the node electrode 33 of the information storage capacitor can be connected with either of the source or drain region SR of the memory cell selection MISFET so that the manufacture can be facilitated to stabilize a connection of a low resistance.

Figure 12:
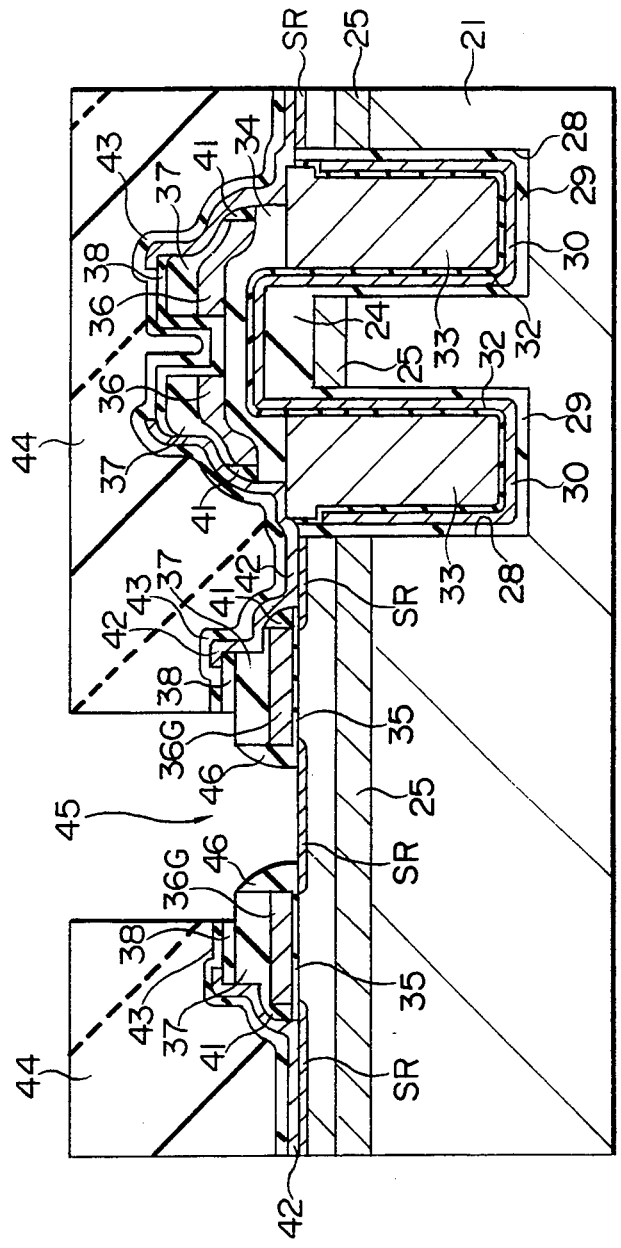

Next, an insulating film 43 such as a silicon oxide film is deposited all over the surface of the p-type semiconductor substrate 21 to have a thickness of about 50 to 150 [nm] by the CVD method. Next, a photoresist film 44 is treated to have a pattern, as shown in FIG. 12, by the photolithography technique. In other words, the photoresist film 44 is patterned to open a window in the surface of the substrate for one of the n-type semiconductor regions SR of the memory cell selection MISFET which is to be connected with the data line 51, i.e., drain region SR of the memory cell selection MISFET. After this, the photoresist film 44 having the pattern shown in FIG. 12 is used as a mask for the anisotropic dry etching such as the RIE thereby to form openings 45. At this time, the gate electrode 36G and the overlying insulating film 37 have their side walls formed with the side wall spacer 46 composed of the insulating films 38 and 43.

Figure 13:
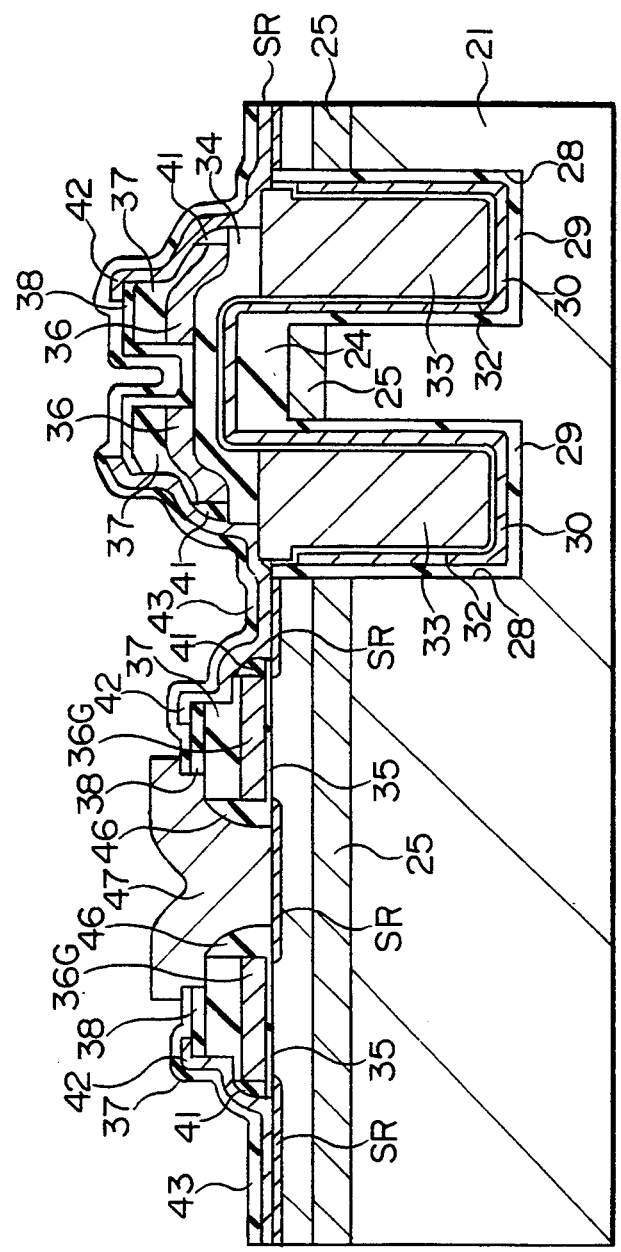

Next, as shown in FIG. 13, a fifth-level poly-silicon layer is deposited to have a thickness of about 50 to 500 [nm]. This poly-silicon layer is one doped with phosphorus or arsenic but may be replaced by a non-doped poly-silicon layer which is then doped with phosphorus or arsenic, as has been described hereinbefore. Moreover, the fifth-level poly-silicon layer is treated by the photolithography and etching techniques with a pattern slightly larger than the openings 45 formed in the insulating film 43, to form a second connecting electrode 47. This second connecting electrode 47 is formed in self-alignment with both the gate electrode 36G and the word lines 36.

Next, as shown in FIG. 2, insulating layers 48 and 49 are formed. These layers serve as a first inter-layer insulating film. The layer 48 is a silicon oxide film 4 formed by the CVD method using an inorganic silane gas and a nitrogen oxide gas as the source gas. On the silicon oxide film 48, a BPSG film 49, for example, is formed. The silicon oxide film 48 is given a thickness of about 30 to 100 [nm], and the BPSG film 49 is given a thickness of about 20 to 1,000 [nm]. Moreover, the BPSG film 49 is subjected to a reflow operation in a nitrogen gas atmosphere at a temperature of about 800 [°C.] or higher so that its surface is flattened. In case the surface flatness is to be enhanced, moreover, the BPSG film 49 is thickened. In this case, after the reflow operation, the etching-back is carried out to have a finish thickness of about 200 to 500 [nm].

Next, an opening 50 is formed in the first inter-layer insulating film. This opening 50 is used for connecting the data lines 51 with the memory cell selecting MISFETs to expose the surface of the second connecting electrode 47 to the outside.

Next, the first connection or wiring layer 51 for forming the data lines 51 is formed. The first wiring layer 51 is made of either a tungsten layer or an aluminum layer containing Si or Cu. In case of the tungsten layer, this layer is formed of a two-layered film composed of a tungsten layer formed by the sputtering method and a tungsten layer formed by the CVD method and has a total thickness of about 50 to 500 [nm].

Next, the second inter-layer insulating film is formed. This second inter-layer insulating film is composed of three-layered silicon oxide films 52, 53 and 54. The lower and upper silicon oxide films 52 and 54 are individually formed by the plasma CVD method using a tetraethoxysilane gas as a source gas and have a thickness of about 50 to 500 [nm]. The intermediate silicon oxide film 53 is an insulating film called the "SOG" (Spin-On-Glass), which is prepared by repeating the rotary application and the baking treatment (at about 450 [°C.]) several times and etched back so that it is left only at the step portion.

Next, openings are formed in the second inter-layer insulating film and then a second connection or wiring layer 55 for constituting column select signal lines (YSL) is formed, with necessary electrical connection being effected through the openings. The second wiring layer 55 is made of either a tungsten layer or an aluminum layer containing Si or Cu. The tungsten layer is formed of a tungsten layer prepared by the sputtering method and a tungsten layer prepared by the CVD method and has a total thickness of about 50 to 800 [nm].

Next, a third inter-layer insulating film is formed. This third inter-layer insulating film is composed of three-layered silicon oxide films 56, 57 and 58. The lower and upper silicon oxide films 54 and 58 are individually formed by the plasma CVD method using a tetraethoxysilane gas as a source gas and have a thickness of about 50 to 500 [nm]. The intermediate silicon oxide film 57 is an insulating film called the "SOG" which is prepared by repeating the rotary application and the baking treatment (at about 450 [°C.]) several times and etched back so that it is left only at the step portion. Since, however, the second inter-layer insulating film is flattened on the memory cells, as shown in FIG. 2, the intermediate silicon oxide film 57 is not present so that it is not shown.

Next, openings are formed in the third inter-layer insulating film and is then a third connection or wiring layer 59 for constituting the shunting word lines 59 is formed, with necessary electrical connection being effected through the openings. This third wiring layer 59 is formed of either an aluminum layer containing Si and Cu or a tungsten layer. In the present embodiment, the third wiring layer 59 is made of the aluminum layer and has a thickness of about 50 to 1,000 [nm]. Even the tungsten layer is used, the third wiring layer 59 is made to have a similar thickness and formed of a laminated film of a tungsten layer prepared by the sputtering method and a tungsten layer prepared by the CVD method.

Next, a passivation film is formed. This passivation film aims at protecting the underling connection or wiring layers or the like and is formed, for example, of a PSG layer 60, a silicon nitride film 61 formed by the plasma CVD method, and a polyimide resin film 62. Here, the PSG film 60 is given a thickness of about 100 to 1,000 [nm], the silicon nitride film 61 is given a thickness of about 500 to 2,000 [nm]; and the polyimide resin film 62 is given a thickness of about 5 to 50 [nm] (after cured). This polyimide resin film 62 is provided for shielding the alpha rays.

The DRAM shown in FIG. 2 is completed by the steps thus far described.

Next, the shape of the transverse conducting layers for interconnecting the plate electrodes in the periphery of the memory blocks will be described with reference to FIG. 14.

Figure 14:
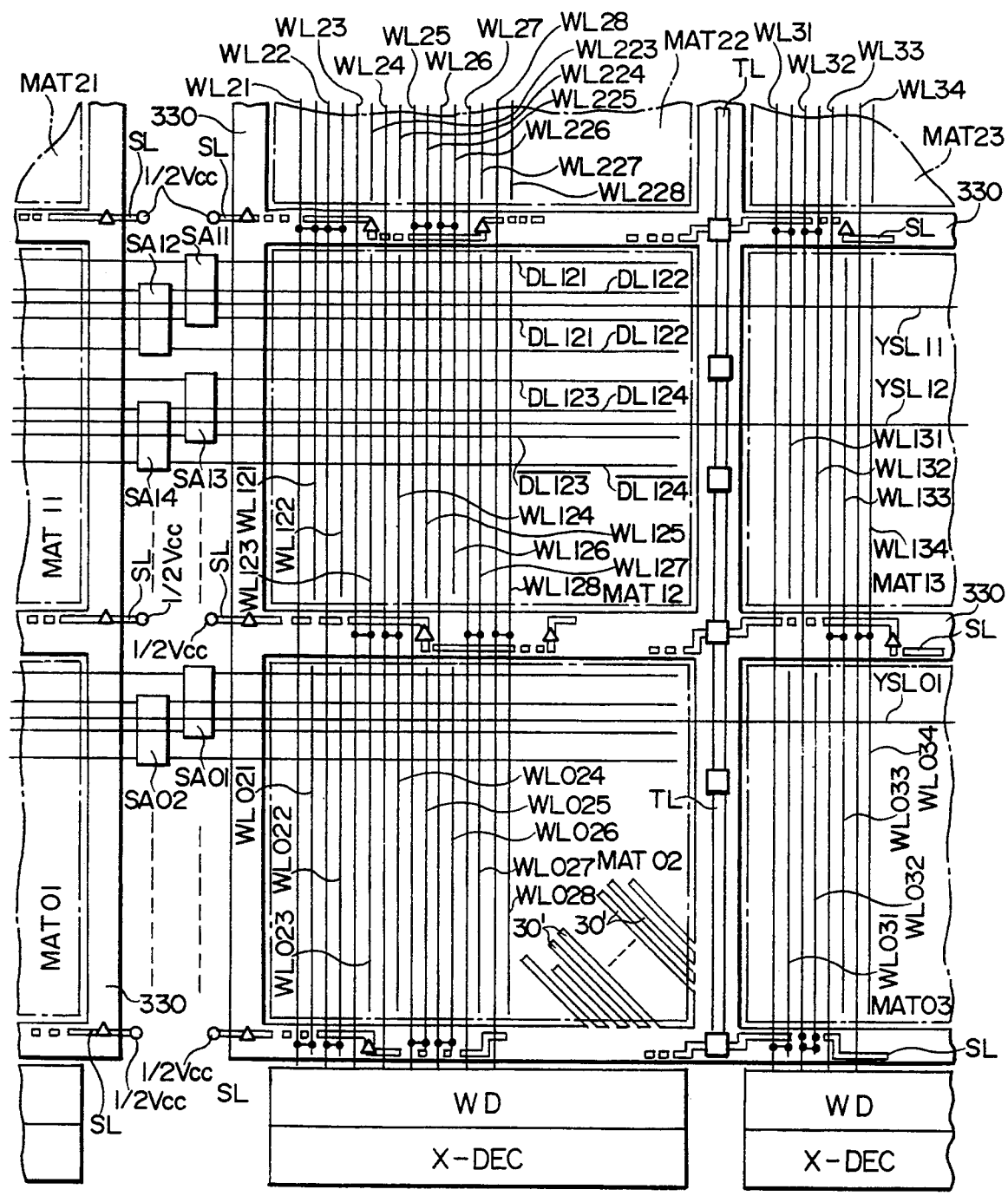
FIG. 14 is a top plan view of an essential portion showing the shape of a plate electrode in the peripheral region of a memory block of the aforementioned DRAM.

In FIG. 14, reference characters MAT01, MAT11, MAT21, MAT02, MAT12, MAT22, MAT03, MAT13 and MAT23 designate memory blocks. Each of these memory block MAT includes the data lines DL, the word lines WL and the memory cells. Between memory blocks MAT11 and MAT12, for example, there are arranged sense amplifiers SA11, SA12, SA13, SA14, . . . , and so on. These sense amplifiers SA are commonly connected with the data lines DL of the memory blocks MAT11 and MAT12. As has been described hereinbefore, on the other hand, the four data lines DL constitute a unit block, in which the four data lines DL constitute two groups of data line pairs and are interdigitated with one another.

The memory block MAT has at its end portion in the column direction a word driver WD and a row decoder X-DEC. The word driver WD is connected with shunting word lines WL21, WL22, WL23, . . . , and WL28. Each memory block MAT is arranged with word lines WL021, WL022, . . . , WL121, WL122, . . . , WL221, WL222, . . . , and so on. Here, the word lines WL021 and WL022 in the memory block MAT02 are individually connected with the shunting word lines WL21 and WL22 in the regions between the memory block MAT02 and the word driver WD. The word line WL023 of the memory block MAT02 and the word line WL123 of the memory block MAT12 are integrated, and the word line WL024 of the memory block MAT02 and the word line WL124 of the memory block MAT12 are likewise integrated. The word lines WL023 and WL123, and the word lines WL024 and WL124 thus integrated are individually connected with the shunting word lines WL23 and WL24 in the regions between the memory blocks MAT02 and MAT12.

Here, the word lines WL121 and WL122 and so on are made of the third-level poly-silicon layer (36), and the shunting word lines WL21 and WL22 and so on are made of the third connection or wiring layer (59). Though omitted from FIG. 14, therefore, the two are connected through the first connection or wiring layer at the same level as the data lines (51) and the second connection or wiring layer at the same level as the column select signal lines YSL (55).

Between the individual memory blocks MAT12 and MAT13, on the other hand, there extend column select signal lines YSL11, YSL12, ..., and so on each for the four data lines DL. The column select signal lines YSL11, YSL12, ..., and so on are formed of the second connection or wiring layer (55), as described above.

As shown in FIG. 1, the transverse conducting layers 30' extend obliquely in the memory block MAT12 and have their end portions connected with each other through a pattern of common potential conductors 330 at the end portion of the memory block MAT12. The potential conductors 330 are integrated at the memory blocks MAT12, MAT02, MAT22, MAT13 and so on. However, the common potential conductors 330 are isolated from one another and made independent between the memory blocks MAT11 and MAT12 at the two ends of the sense amplifier SA.

The common potential conductor pattern 330 are formed of the first-level poly-silicon layer shared with the transverse conducting layers 30'. Between the memory block MAT12 and the memory blocks MAT02 and MAT22 and between the memory block MAT02 and the word driver WD, therefore, the common potential conductors 30 are shunted through (or connected in parallel with) the second connection or wiring layer or shunt conductors SL at the same level as the column select signal lines (55). In FIG. 14, the triangles indicate nodes between the shunt conductors SL and the common potential conductors 330 through the first connection or wiring layer at the same level as the data lines (51). Moreover, these connections are accomplished in the regions between the nodes between the word lines WL and the shunting word lines WL.

In the regions between the memory blocks MAT12 and MAT13, moreover, the third connection or wiring layer, i.e., shunt conductor TL, which is at the same level as the shunting word lines (59), is extended over the common potential conductors 330 to shunt (or to be connected in parallel with) them. The shunt conductor TL used for the shunting is connected with the common potential conductors 330 through the first connection or wiring layer at the same level as the data lines (51) and the second connection or wiring layer at the same level as the column select signal lines YSL (55) in the regions between the column select signal lines YSL11, YSL12, ..., and so on, as indicated by squares. Moreover, the shunt conductors SL and the shunt conductors TL are connected at their crossing points. A fixed potential of ½ Vcc such as 1.65 V is applied to the shunt conductors SL and TL.

Thus, the memory block MAT is arranged in its periphery with means for reducing the potential fluctuations such as the transverse conducting layers 30' and/or the common potential conductor pattern 330.

As apparent from the description thus far made, according to the present embodiment, the following effects can be achieved:

(1) As can be seen from the structure shown in FIG. 2, the area required for the semiconductor doped region SR connected with the information storage capacitor is substantially determined by the following factors.

a) a minimum patterning width dimension: F (e.g., 0.4 μm)
b) a side wall length: S (e.g., 0.05 μm-0.07 μm)
c) an area necessary for an electrical contact between the conducting layer or the first connecting electrode 42 and the doped region SR: $\epsilon$ (e.g., 0.01 μm)
d) an area for allowing an alignment tolerance between the word line 36 (gate electrode 36G): Δ (e.g., 0.15 μm-0.2 μm)

Further, assuming that the width of the gate of a memory selection MISFET is equal to the minimum patterning width dimension F, the area of the doped region SR of the MISFET in a memory cell will be, for example:

$$F \times (S + \epsilon + \Delta) = 0.084 - 0.112 \ \mu m^2$$

Meanwhile, if a stacked capacitor cell described in the BACKGROUND OF THE INVENTION is fabricated under the above-mentioned conditions, the area of a doped region in a memory cell will be:

$$F \times (F - S) = 0.14 - 0.132 \ \mu m^2$$

even though word line conductors were spaced apart from each other the minimum patterning width dimension. Thus, the latter are will be larger than the former area according to an embodiment of the present invention in any case.

Namely, by the use of the first connecting electrode 41 for effecting electrical connection between the doped region SR and the node electrode 33 in a memory cell, the area of the doped region SR in the memory cell can be minimized. As a result, leakage current from the storage capacitor can be effectively suppressed, which reduces power consumption of the semiconductor device.

(2) In the DRAM, the surface step of the insulating film over the information storage capacitor can be reduced, which will increase the possibility of allowing the reduced surface step by the focus margin in the lithography, and fine wiring conductor pattern is made possible.

(3) In the DRAM, since the insulating film 29 is formed on the inner wall of the trench 28 of the storage capacitor, the leakage current of the storage capacitor can be reduced to realize a low power consumption.

(4) In the DRAM, it is possible to realize a memory cell which is strong against the soft errors due to the alpha rays.

(5) In the DRAM, the connection between the memory cell selection MISFET and the storage capacitor can be facilitated to stabilize the connections.

(6) In the DRAM, the manufacture process can be simplified to improve the production yield.

(7) In the DRAM, the potential of the plate electrodes can be stabilized to prevent any malfunction.

(8) In the DRAM, the memory cell selection MISFET and the information storage capacitor can be connected through the electrode self-aligned with the world line to miniaturize the memory cell.

Embodiment 2

Next, a second embodiment of the present invention will be described with reference to FIGS. 15 to 24.

Figure 23:
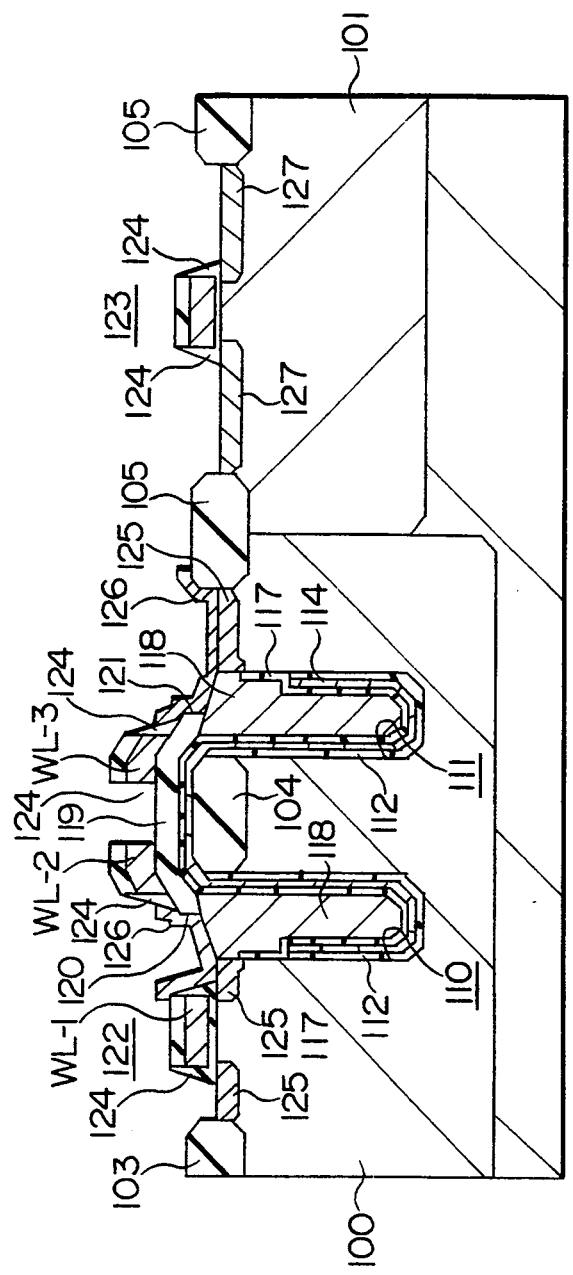
Figure 24:
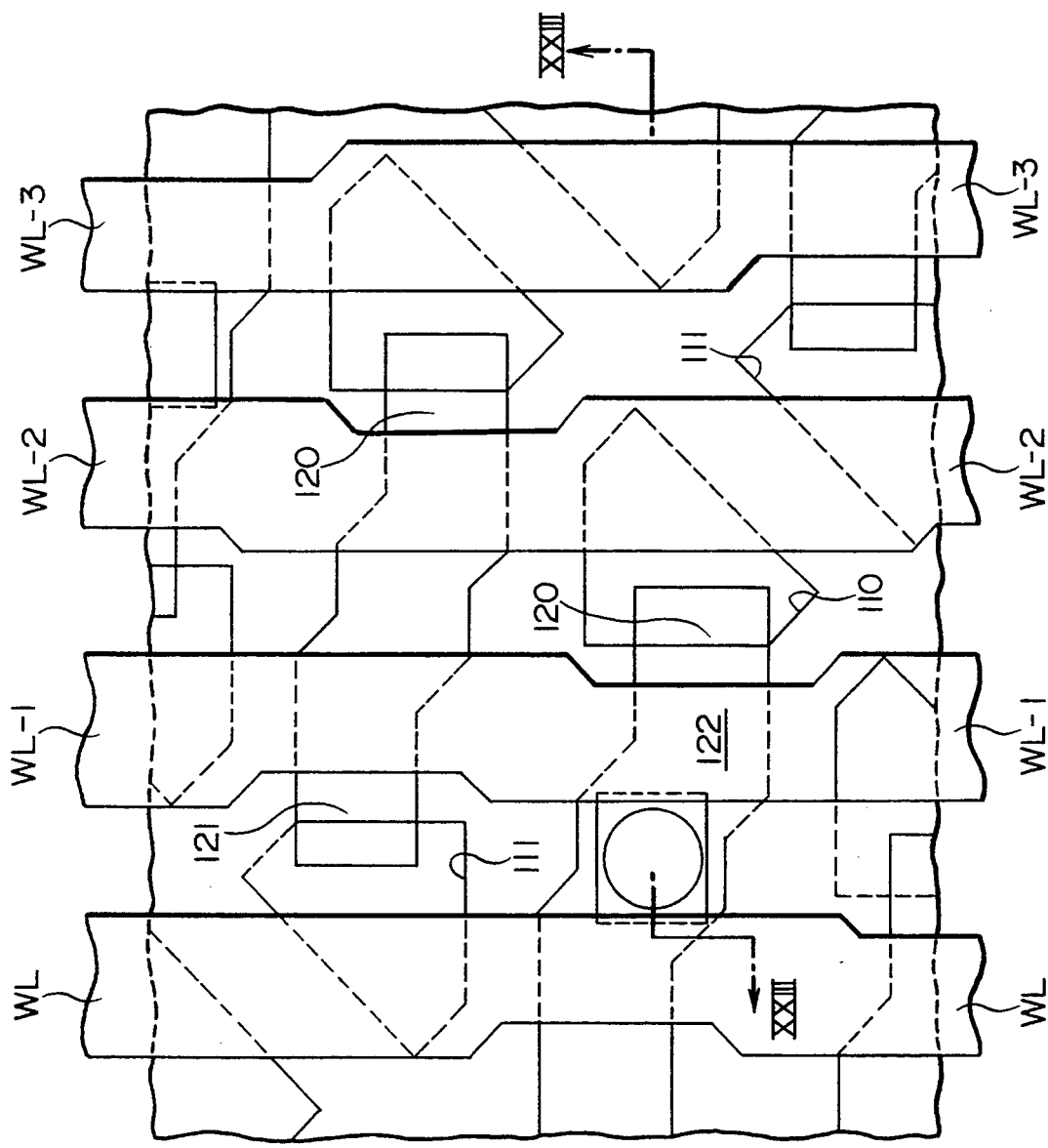
FIG. 24 is a section showing an essential portion of the memory cell of the aforementioned DRAM manufactured through the steps shown in FIGS. 15 to 23.

FIG. 23 shows sectional structures of a memory cell of the DRAM and a p-channel MISFET of a peripheral circuit (of which the connection or wiring layers are omitted because they are similar to those of the foregoing embodiment), and FIG. 24 is a top plan view showing the memory cell. Incidentally, the sectional structure of the memory cell shown in FIG. 23 corresponds to a portion taken along line XXIII—XXIII of FIG. 24.

As shown in FIGS. 23 and 24, the connection between the memory cell selection MISFET of the DRAM and the information storage capacitor is accomplished by a direct contact at the side of a trench 110 or 111 and a conducting layer or a connecting electrode 126 on the semiconductor substrate.

Next, the process for manufacturing the aforementioned DRAM will be described in the following.

Figure 15:
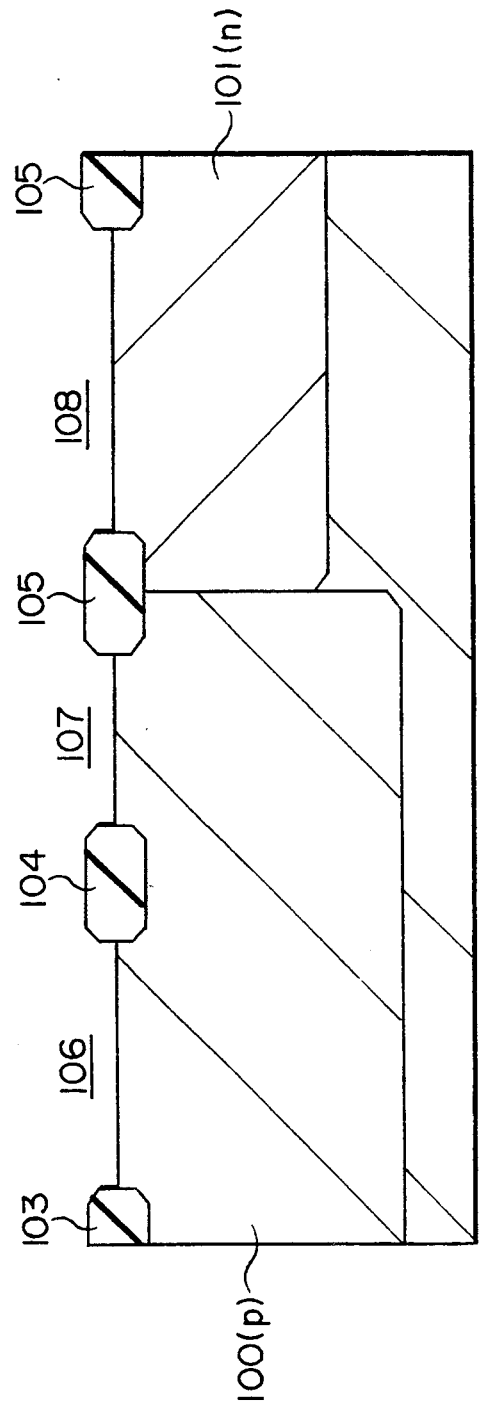
FIGS. 15 to 23 are sections showing a portion at respective manufacturing stages of a DRAM according to Embodiment 2 of the present invention.

At first, as shown in FIG. 15, steps similar to those for manufacturing the ordinary DRAM are carried out to form a p-type well region 100 and an n-type well region 101 on a semiconductor substrate. After this, element isolating insulating films 103, 104 and 105 and active region portions 106, 107 and 108 are formed. After this, an impurity ion implantation is carried out, if necessary, for the element isolation or for the threshold value adjustment.

Figure 16:
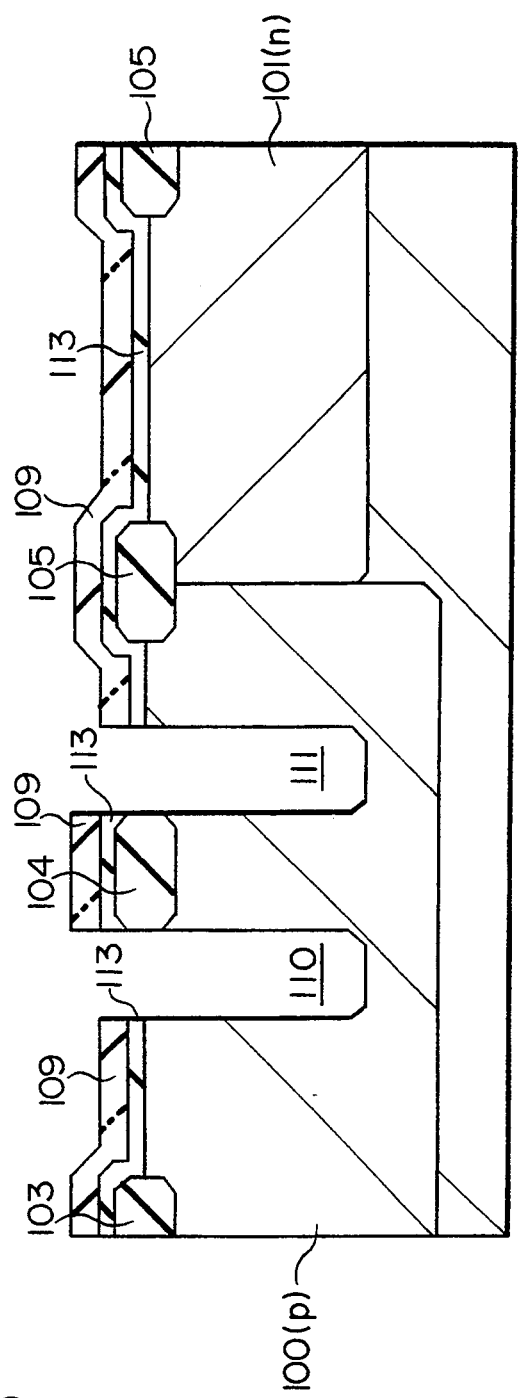

Next, as shown in FIG. 16, like the manufacture steps of the trench type DRAM, a masking member 109 is deposited through a silicon oxide film 113, and trenches 110 and 111 are formed for forming the storage capacitor.

Figure 17:
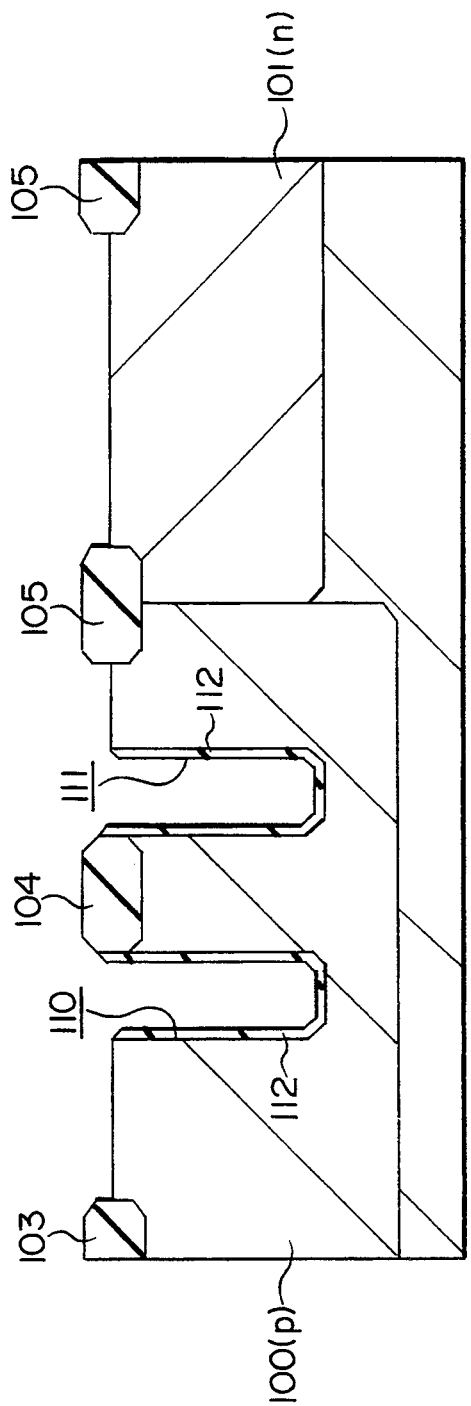

Next, the masking member 109 for forming the trenches 110 and 111 is removed, and a silicon oxide film 112 for isolating the storage capacitor is then formed by the thermal oxidation and/or the CVD method, as shown in FIG. 17. After this, the silicon oxide film 112 is etched back off from the semiconductor substrate.

Figure 18:
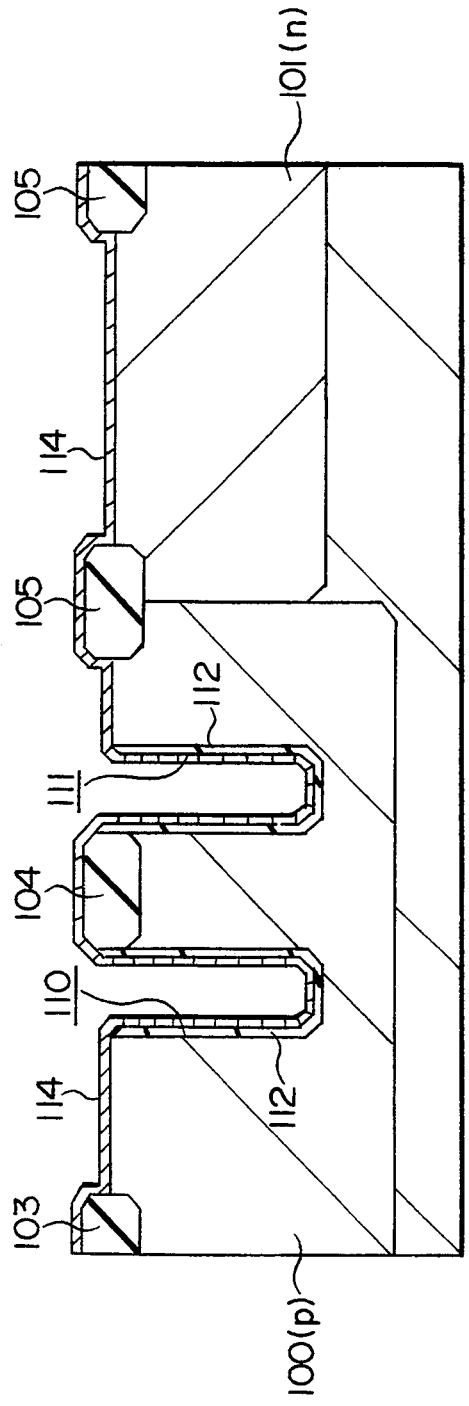

Next, as shown in FIG. 18, an n-type poly-silicon layer is deposited for forming a plate electrode 114. In case the n-type doped poly-silicon layer is not used, the non-doped poly-silicon layer may be deposited and then doped into an n-type by the ion implantation means of phosphorus or arsenic.

Figure 19:
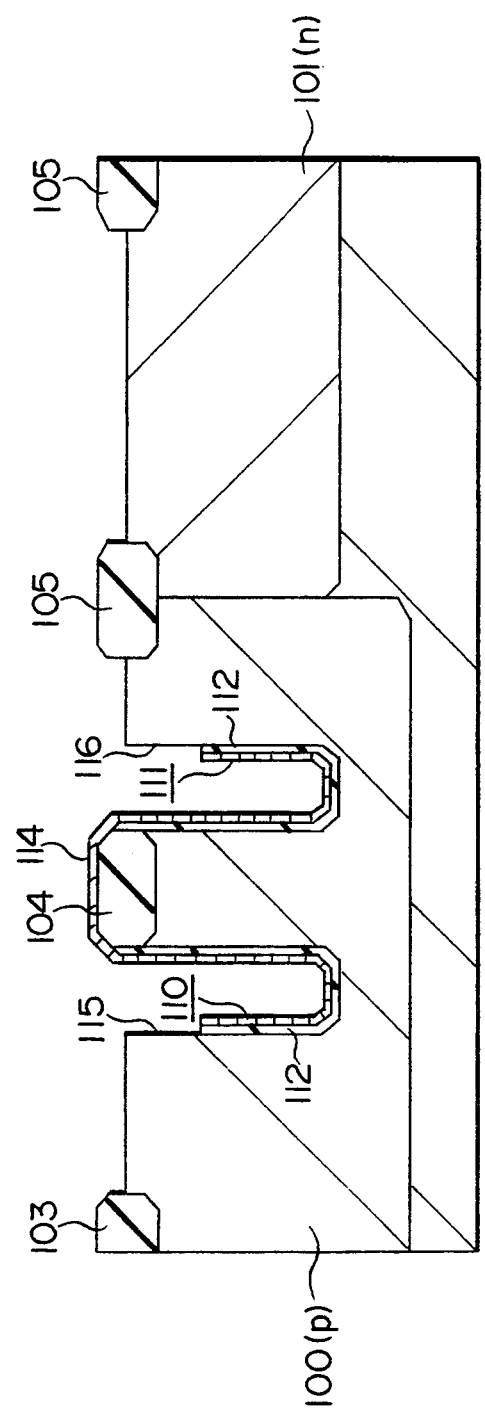

Next, as shown in FIG. 19, a storage node electrode 118 has its contact forming portions 115 and 116 patterned to remove the silicon oxide film 112 for separating the storage capacitor and the n-type poly-silicon layer of the plate electrode 114.

Figure 20:
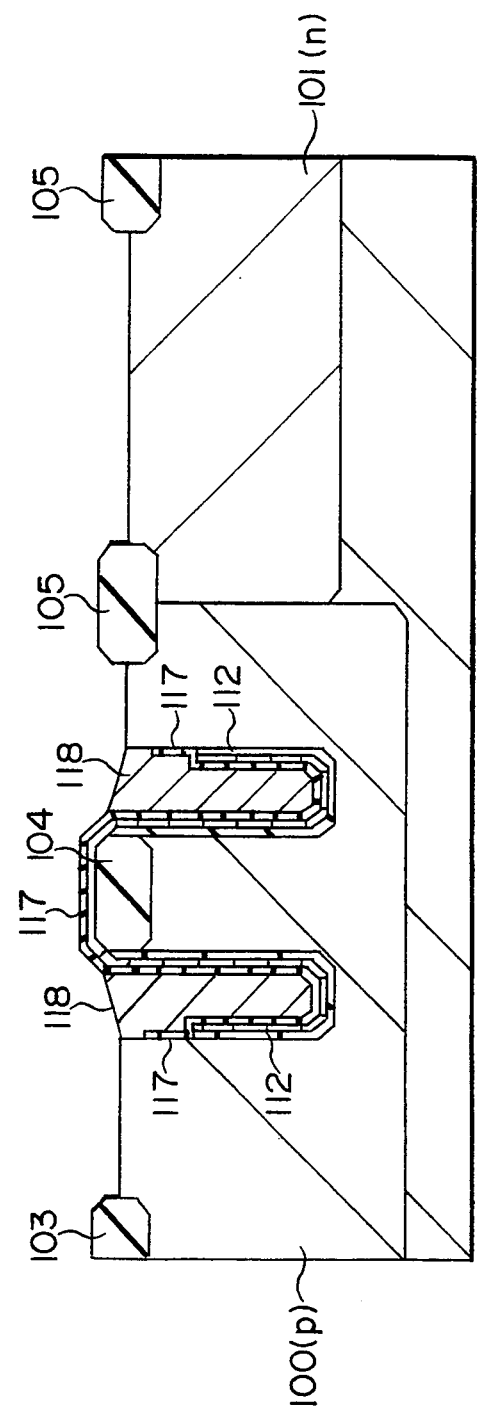

Next, as shown in FIG. 20, a dielectric film (or a capacitor insulating film) 117 is formed, and an n-type doped poly-silicon layer for forming the storage node electrode 118 is then deposited. After this, the poly-silicon layer is etched back off the surface of the semiconductor substrate.

Figure 21:
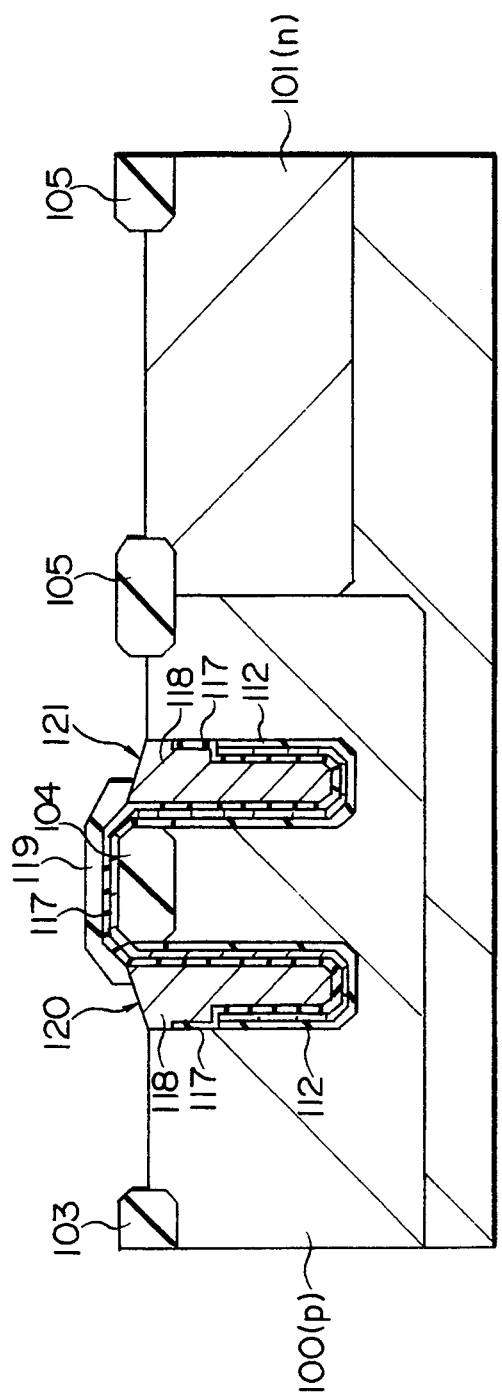

Next, as shown in FIG. 21, an inter-layer insulating film 119 is deposited between the word lines (WL or pass gates) and the storage node electrode 118. After this, surface contact portions 120 and 121 are removed from the storage node electrode 118, and the inter-layer insulating film 119 is removed from the portion in which the storage node electrode 118 is absent.

Figure 22:
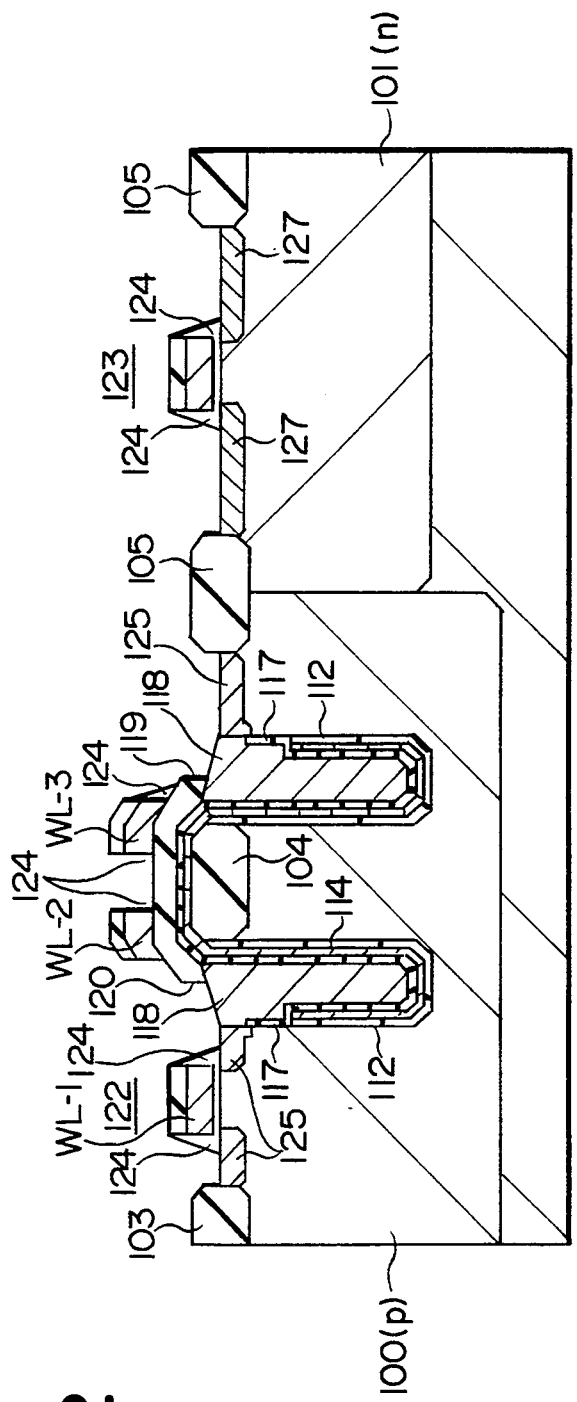

Next, as shown in FIG. 22, a memory cell selection MISFET 122 for writing and reading charges in and from the information storage capacitor and a p-channel MISFET 123 of a peripheral circuit are formed (together with an n-channel MISFET of the peripheral circuit). At this time, an insulating film 124 made of a silicon oxide film or silicon nitride film is formed on each of the upper portion or sides of the gate electrode or the word lines of the memory cell selection MISFET or the like. In FIG. 22, reference numeral 125 designates an n-type semiconductor region to be used for the source or drain region, and numeral 127 designates a p-type semiconductor region to be sued for the source or drain region. Moreover, the n-type semiconductor region 125 of the source or drain region of the memory cell selection MISFET is connected directly with the storage node electrode 118.

Next, as shown in FIG. 23, the storage node electrode 118 and the n-type semiconductor region 125 of the source or drain region of the memory cell selecting MISFET 122 are connected by a connecting electrode 126. This connecting electrode 126 is formed of an n-type doped poly-silicon layer.

In the following, like the process for forming the ordinary DRAM, a heavily doped p-type semiconductor region (or a heavily doped n-type semiconductor region in the n-channel MISFET) of the source or drain region of the p-channel MISFET of the peripheral circuit is formed.

As apparent from the description thus far made, according to the present embodiment, the following effects can be attained because the DRAM can take the direct contact at the sides of the trenches and the contact above the trenches:

(1) The connection between the memory cell selection MISFET and the storage node electrode (or storage node) can be easily achieved.

(2) By using together the direct contact of the storage node electrode itself at the side faces of the trenches and the connection on the surface of the semiconductor substrate, the margin between the memory cell selection MISFET and the plate electrode of the information storage capacitor (or the charge storing capacitor) can be easily retained.

Although our invention has been specifically described hereinbefore in connection with the foregoing embodiments, it should not be limited to those embodiments but can naturally be modified in various manners without departing from the gist thereof.

What is claimed is:

1. A semiconductor integrated circuit device having a semiconductor memory cell array, said cell array including word lines each extending in a first direction and data lines each extending in a second direction substantially perpendicular to the first direction and a plurality of memory cells each provided at a cross point between one of said word lines and one of said data lines and having a cell selection transistor and an information storage capacitor connected in series with each other;

wherein the device comprises a semiconductor substrate having a main surface in which a plurality of trenches are formed, each of said trenches having an inner wall;

wherein the cell selection transistor in one cell includes first and second doped regions formed in said main surface of said semiconductor substrate, said first doped region being connected with one of said data lines, a first insulating film formed on said main surface of said semiconductor substrate between said first and second doped regions, and a control electrode layer formed on said first insulating film between said first and second doped regions and connected with one of said word lines;

wherein the information storage capacitor connected in series with the transistor to comprise said one cell includes a second insulating film formed on the inner wall and bottom of one of said trenches, said second doped region of said transistor terminating at said inner wall of said one trench, an electrode layer formed on said second insulating film and serving as a first electrode of said capacitor, a dielectric film formed on said electrode layer, and a conducting material provided to fill a space defined by said dielectric film in said one trench and serving as a second electrode of said capacitor;

wherein the device further comprises a conducting layer extending both on said second doped region and said conducting material in said one cell to electrically interconnect them in a series connection, and a plurality of transverse conducting layers extending in a third direction not parallel with said first and second directions to traverse said word lines and said data lines, each of said transverse conducting layers interconnecting first electrodes for different plural ones of said capacitors.

2. A semiconductor integrated circuit device according to claim 1, further comprising a third insulating film formed on said conducting layer and a first inter-layer film formed on said third insulating film to provide a substantially flat surface, said data line extending on said flat surface of said first inter-layer film.

3. A semiconductor integrated circuit device according to claim 1, wherein the device further comprises a pattern of common potential conductors; and shunt conductors connected in parallel with said pattern of common potential conductors for enhancing electric conduction of the latter, each of said transverse conducting layers being connected with said common potential conductors.

4. A semiconductor integrated circuit device according to claim 1, wherein said second doped region of the cell selection transistor in said one memory cell terminating at said wall of said one trench has its terminating end in an electrical contact with said conducting material on said wall of said one trench in said one memory cell.

5. A semiconductor integrated circuit device according to claim 1, further comprising a doped layer formed at a level deeper in said substrate than said first and second doped regions as seen from said main surface of said substrate and being in contact with said second insulating films in said trenches.

6. A semiconductor integrated circuit device including a plurality of memory cells each having an information storage capacitor and a memory cell selecting MISFET connected in series, comprising:

(a) a semiconductor substrate of a first conductivity type having a plurality of trenches in a principal surface of the semiconductor substrate;

(b) a first insulating film formed on a bottom and a side wall of each of said trenches;

(c) a first electrode formed on said first insulating film;

(d) a second insulating film formed on said first electrode;

(e) a second electrode formed over said second insulating film;

(f) a third electrode formed over the principal surface of said semiconductor substrate through a third insulating film, said third electrode extending in a first direction to comprise a word line;

(g) first and second semiconductor regions of a second conductivity type formed in the principal surface of said semiconductor substrate at opposite ends of said third electrode, said second semiconductor region being electrically connected with said second electrode;

(h) a first wiring comprising a data line electrically connected with said first semiconductor region and extending in a second direction substantially perpendicular to said first direction; and (i) a plurality of sixth electrodes extending in a third direction, not parallel with said first and second directions, to traverse said word lines and data lines, each of said sixth electrodes interconnecting first electrodes for different ones of said capacitors.

7. A semiconductor integrated circuit device according to claim 6, wherein said first insulating film has such a thickness that an inversion layer is not formed on a surface of said semiconductor substrate by a fixed potential applied to said first electrode.

8. A semiconductor integrated circuit device according to claim 6, wherein said first wiring is connected with said first semiconductor region through a fourth electrode.

9. A semiconductor integrated circuit device according to claim 8, wherein said first wiring is comprised of tungsten, and wherein said fourth electrode is comprised of poly-silicon.

10. A semiconductor integrated circuit device according to claim 6, wherein said second wiring is comprised mainly of aluminum.

11. A semiconductor integrated circuit device according to claim 6, wherein said first insulating film has a thickness about three times or more as large as that of said third insulating film.

12. A semiconductor integrated circuit device according to claim 6, wherein said semiconductor substrate is formed therein with a third semiconductor region positioned below said first and second semiconductor regions, and wherein said third semiconductor region has a conductivity type identical with that of said semiconductor substrate and a higher impurity concentration than that of said semiconductor substrate and contacts with said first insulating film at the side walls of said trenches.

13. A semiconductor integrated circuit device according to claim 6, wherein said first insulating film extends from the side walls of said trenches to the principal surface of said semiconductor substrate.

14. A semiconductor integrated circuit device according to claim 13, wherein said second semiconductor region contacts with said first insulating film at the principal surface of said semiconductor substrate.

15. A semiconductor integrated circuit device as set forth in claim 6, further comprising a fifth electrode for connecting said second electrode and said second semiconductor region electrically at the principal surface of said semiconductor substrate.

16. A semiconductor integrated circuit device as set forth in claim 15, wherein said fifth electrode is made of poly-silicon.

17. A semiconductor integrated circuit device according to claim 6, wherein said plurality of memory cells comprise memory blocks, and wherein each of said sixth electrodes is electrically connected with another sixth electrode in a common layer at a level of said sixth electrodes between the memory blocks.

18. A semiconductor integrated circuit device according to claim 17, wherein said sixth electrodes are connected at the end portions of their associated memory blocks with layers having a lower resistance than that of said sixth electrodes.

19. A semiconductor integrated circuit device according to claim 6, wherein said trenches have side faces substantially normal to said principal surface.

20. A semiconductor integrated circuit device according to claim 6, wherein said first electrode is coupled to a predetermined fixed potential.

21. A semiconductor integrated circuit device according to claim 6, wherein each of said sixth electrodes is band-shaped.

* * * * *